United States Patent
Hougham et al.

(10) Patent No.: US 7,417,315 B2
(45) Date of Patent: Aug. 26, 2008

(54) NEGATIVE THERMAL EXPANSION SYSTEM (NTES) DEVICE FOR TCE COMPENSATION IN ELASTOMER COMPOSITES AND CONDUCTIVE ELASTOMER INTERCONNECTS IN MICROELECTRONIC PACKAGING

(75) Inventors: Gareth Geoffrey Hougham, Ossining, NY (US); S. Jay Chey, Ossining, NY (US); James Patrick Doyle, Bronx, NY (US); Xiao Hu Liu, Croton On Hudson, NY (US); Christopher V. Jahnes, Upper Saddle River, NJ (US); Paul Alfred Lauro, Brewster, NY (US); Nancy C. LaBianca, Yalesville, CT (US); Michael J. Rooks, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 10/310,532

(22) Filed: Dec. 5, 2002

(65) Prior Publication Data

US 2004/0110322 A1 Jun. 10, 2004

(51) Int. Cl.
*H01L 21/302* (2006.01)
*B32B 5/22* (2006.01)
*G02B 26/00* (2006.01)

(52) U.S. Cl. ................ 257/747; 257/758; 257/E23.08; 257/E23.128; 428/317.9; 359/291

(58) Field of Classification Search ................ 257/747, 257/758, 701, E23.08, E23.128; 428/317.9, 428/295.1; 359/291, 290
See application file for complete search history.

(56) References Cited

U.S. PATENT DOCUMENTS

| | | | | |
|---|---|---|---|---|
| 5,452,878 A | * | 9/1995 | Gravesen et al. | 251/129.02 |
| 6,513,939 B1 | * | 2/2003 | Fettig et al. | 359/847 |
| 6,768,412 B2 | * | 7/2004 | Becka et al. | 337/36 |
| 6,846,087 B2 | * | 1/2005 | Carr et al. | 359/846 |
| 6,922,272 B1 | * | 7/2005 | de Groot et al. | 359/291 |
| 2002/0054466 A1 | * | 5/2002 | Wood et al. | 361/277 |

* cited by examiner

*Primary Examiner*—Zandra V. Smith
*Assistant Examiner*—Ron Pompey
(74) *Attorney, Agent, or Firm*—F. Chau & Associates, LLC

(57) ABSTRACT

A Negative Thermal Expansion system (NTEs) device for TCE compensation or CTE compensation in elastomer composites and conductive elastomer interconnects in microelectronic packaging. One aspect of the present invention provides a method for fabricating micromachine devices that have negative thermal expansion coefficients that can be made into a composite for manipulation of the TCE of the material. These devices and composites made with these devices are in the categories of materials called "smart materials" or "responsive materials." Another aspect of the present invention provides microdevices comprised of dual opposed bilayers of material where the two bilayers are attached to one another at the peripheral edges only, and where the bilayers themselves are at a minimum stress conditions at a reference temperature defined by the temperature at which the bilayers are formed. These devices have the technologically useful property of volumetrically expanding upon lowering of the device temperature below the reference or processing temperature.

30 Claims, 26 Drawing Sheets

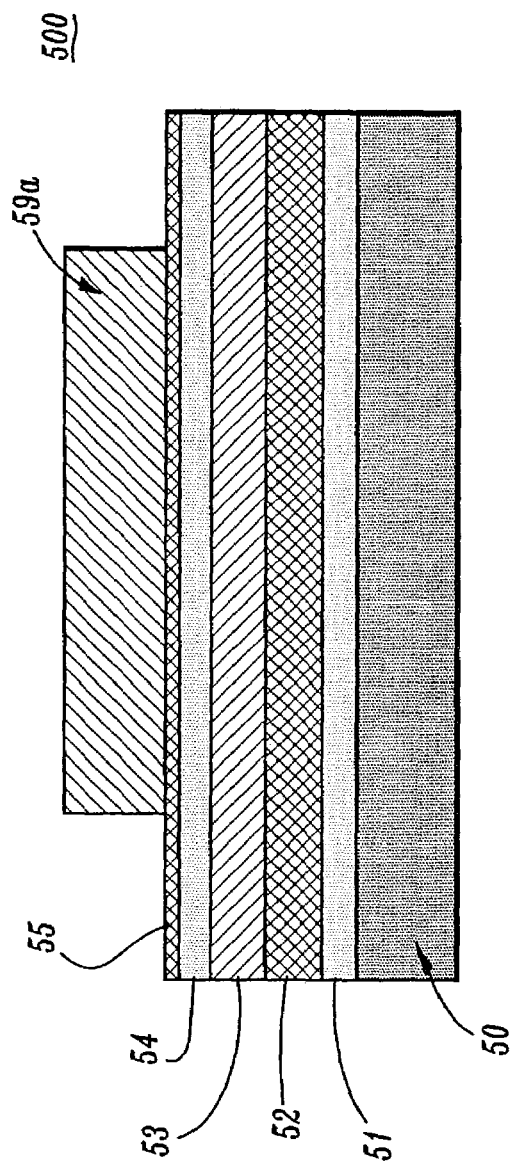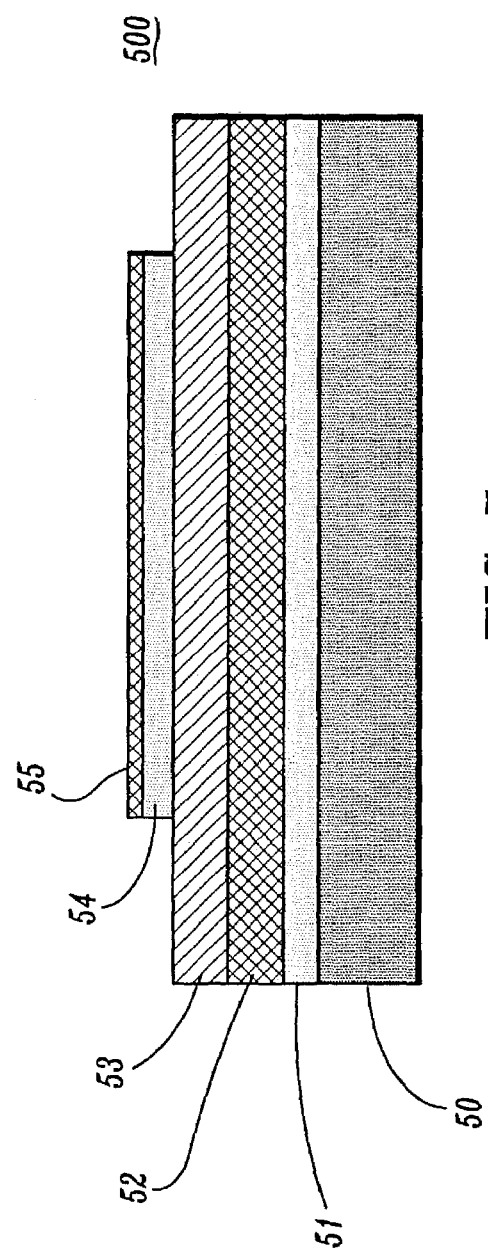

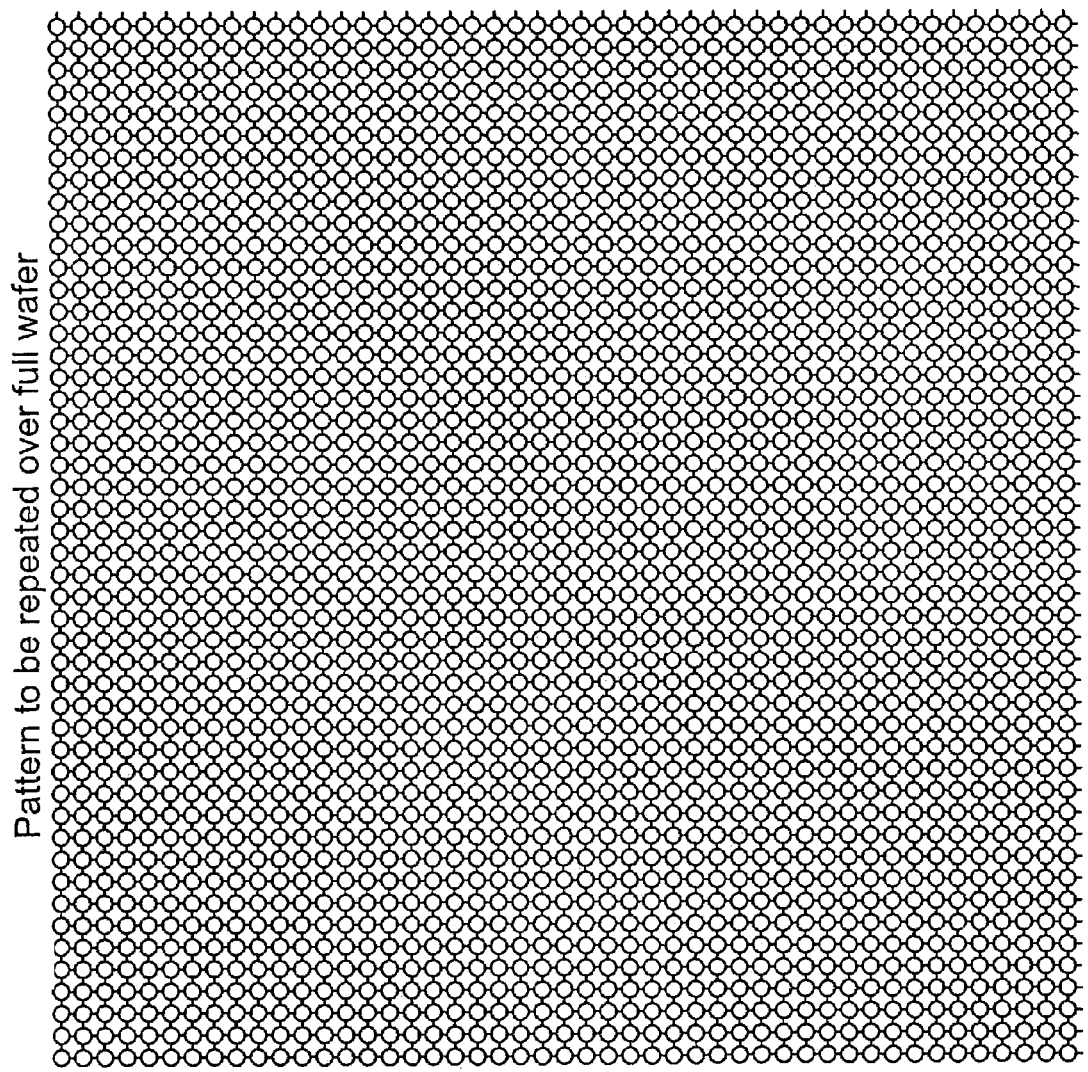

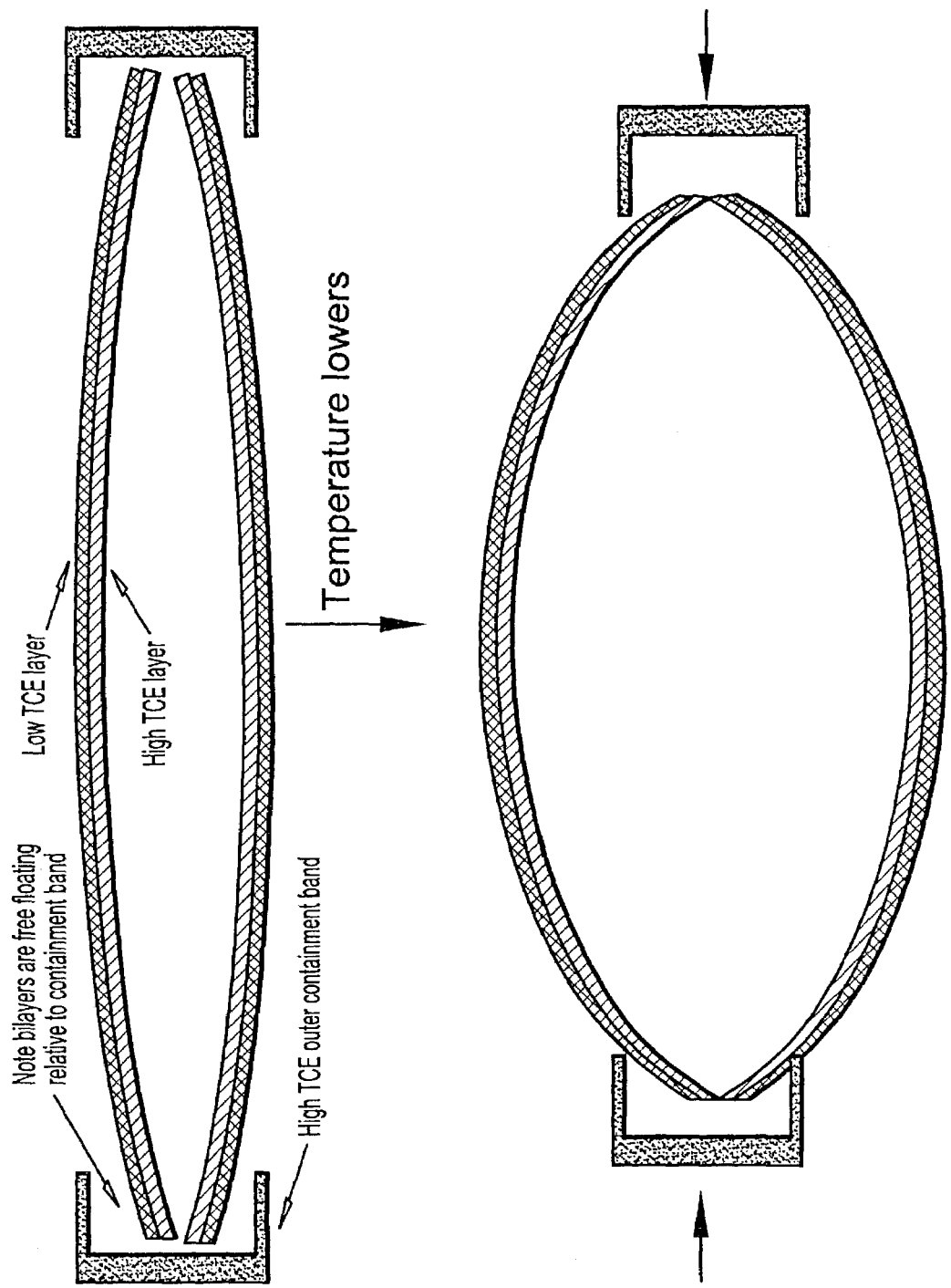

NEGATIVE THERMAL EXPANSION SYSTEM (NTES) DEVICE FOR TCE COMPENSATION IN ELASTOMER COMPOSITES AND CONDUCTIVE ELASTOMER INTERCONNECTS IN MICROELECTRONIC PACKAGING

BACKGROUND OF THE INVENTION

1. Field of the Invention

The present invention, generally, relates to Microelectromechanical Systems (MEMs) processes commonly used in semiconductor manufacturing, but applied to composite materials and "smart materials" or "responsive materials". More particularly, the present invention relates to methods for incorporating a negative thermal expansion system (NTEs) device in elastomer or soft composite materials and in conductive elastomer interconnects in microelectronic packaging.

2. Description of Related Art

In many areas of technology, the difference in coefficient of thermal expansion (TCE) between bonded parts or layers creates stresses that are highly problematic. In many cases such stresses are limiting factors because the strength of the materials or the interfaces between them are unable to withstand them during temperature excursion. When the materials in question have high elastic modulae, the TCE mismatch problem is exacerbated. When they are softer, the mismatch is partly mitigated by elastic deformation. However, this does not fully counter the problems associated with TCE mismatch, and indeed there is a class of uses for elastomers in technology for which the considerations are quite different. These are when the elastomer is employed to provide a restoring force while in compression. When such is the case, the restoring force will be reduced upon a decrease in ab-21solute temperature due to the TCE-driven contraction. Indeed, if the restoring force is small and the temperature decrease large, the elastomer can transition from being in compression to being in tension. This assumes an adhesive bond. If no such adhesive bond exists, or if the adhesion fails during the compression/tension transition, then contact may be lost altogether when the restoring force becomes less than zero. If the role of the elastomer is both to provide adequate restoring force and to provide conductivity (either electrical or thermal) then that conductivity will suddenly be interrupted upon loss of contact.

To minimize this problem materials have traditionally been engineered in a variety of ways to have a low TCE while balancing other necessary properties. One such approach has been to form composites with a low TCE material in a host polymer matrix. Typically, quartz (SiO2) filler in a thermoset polymer like epoxy. In another example, the organic fiber Kevlar is known to have a negative TCE in the fiber direction (only) and composites made with oriented Kevlar strands have reduced TCE in that direction. Many low or negative TCE materials have drawbacks, which have made them unattractive for some applications, notably microelecronics.

In addition, the control of thermal expansion is particularly important in elastomers (e.g. rubber), which has a notoriously high expansion coefficient limiting its use in many high technology applications. Of particular immediate interest is the fabrication of small conducting elastomer interconnect contacts for high-end microelectronic packaging. In traditional examples of such contacts, an electrically conducting material such as metallic silver particles are mixed into siloxane rubber and molded into small conducting contacts. These contacts are fabricated into a 2-dimensional array and used as a so-called Land Grid Array (LGA) connection between a chip module and a printed circuit board. However, because these contacts have a high TCE, they are unreliable and are rendered unsuitable for use in high performance computers where reliability on an individual contact basis must be measured in failure rates at the ppm to ppb level. This high reliability requirement stems from a full system dependence on non-redundant signal contacts—if even one out of many thousands fail, an entire node or the entire computer can fail. If the TCE could be reduced in such typical contacts while maintaining the desirable properties such as elasticity and conductivity, this would significantly increase the reliability. This in turn would reduce the cost of replacing chip modules in the field by allowing field replacibility of chip modules using LGA interconnects.

Herein we discuss an innovative approach based on the fabrication of a multitude of negative thermal expanding systems devices (NTEs) that have significantly negative coefficients of thermal expansion, and on the incorporation of such NTEs into an elastomer to form a composite with reduced, zero, or negative net TCE. This approach addresses a number of general engineering concerns such as the reduction of TCE-based stresses to levels that allows fabrication of structures not previously possible and such as extending the operating conditions under which elastomer composites will be able to maintain positive restoring forces to opposing surfaces. In particular we disclose herein the fabrication of LGA interconnect devices using such composite materials as the conducting elastomer.

These NTEs devices may also be used to form negative thermal expansion foams by fusing or adhering the NTEs together with no host elastomer.

The general concept of negative TCE micro machines is disclosed, as are process techniques and composite structures. Also disclosed are previously unidentified applications for negative TCE composites in general.

SUMMARY OF THE INVENTION

This disclosure teaches the fabrication of mechanical devices that have a negative coefficient of thermal expansion (TCE) and optionally their inclusion as filler in another material, such as a soft rubber material. The anticipated size scale is primarily in the micrometer range, though both larger and smaller are also anticipated. It also describes how these NTEs can be incorporated as a powder into a host elastomer material to form a composite with a reduced, zero, or negative TCE. It also teaches how the outside layer of the NTEs particles can be made to be electrically conducting so that the elastomer composites can be electrically conducting if the amount of NTEs filler exceeds the percolation threshold. It also teaches how Land Grid Array (LGA) interposers can be advantageously fabricated using such composites. It also teaches how the outside layer can be made of electrically insulating layer so that the elastomer composite is insulating. It also teaches how these NTEs devices can be used in pure or nearly pure form as solid foam by fusing or adhering the particles together.

A Negative Thermal Expansion system (NTEs) device for TCE compensation in elastomer composites and conductive elastomer interconnects in microelectronic packaging according to one aspect of the invention. A (NTEs) device comprising a first bilayer having an inner and an outer layer, wherein the outer layer is of composed of a material having a lower coefficient of thermal expansion than an inner layer of material, and a second bilayer having an inner and an outer layer, wherein the outer layer is composed of a material having a lower coefficient of thermal expansion than a inner layer of material, wherein the first and second bilayers are joined together along a perimeter of the inner layers of the material having a higher coefficient of thermal expansion.

Further, the first and second bilayers may be directly fused together along the perimeter of the inner layers of material thereby forming a joint and a remaining unjoined portion of the inner layers are able to separate and flex thereby forming a cavity.

The NTEs device may also include an adhesion layer for joining the first and second bilayer together, wherein the adhesion layer is an outer wall around the cavity. In addition, the adhesion layer is either a fine line of adhesive or a layer of material. Further, the adhesive layer may be chromium, titanium, or any materials that have adhesive properties to the layers in question and that do not otherwise adversely affect the structure.

The first and second bilayers of the device above may also be formed and connected at a predetermined temperature rendering the device in a low stress and geometrically flattened state, and the device becomes stressed at a temperature lower than the predetermined temperature causing a curvature in the first and second bilayers in opposing directions that will increase the volume of the void between the first and second bilayer and increase the overall volume occupied by the device. In addition, the predetermined temperature is an operating temperature of a final engineering application, e.g. a semiconductor chip having a predetermined temperature of approximately 100° C.

Further, the first and second bilayers may be joined by a circular band with right angle projections at the edge to contain the bilayers from escaping their relative orientation relative to one another whereby enhancing the negative coefficient of thermal expansion behavior.

According to another aspect of the present invention provides a method for fabricating a Negative Thermal Expanding system (NTEs) comprising heating a substrate to a desired reference temperature, depositing a blanket of an organic release layer onto the substrate, depositing a first layer of material onto the organic released layer, depositing a second layer of material having a greater TCE value than the first layer material, depositing a decomposable polymer layer onto the second layer of material, patterning the decomposable polymer layer into disk shapes with finger-like appendages radiating from the disk, depositing a third layer of material having the same TCE value as the second layer of material over the decomposable polymer layer, depositing a fourth layer of material having the same TCE value as the first layer of material onto the third layer material, depositing a layer of photoresist onto the fourth layer material, lithographically patterning such that the disk shapes of resist are left covering the decomposable polymer disks buried below and orienting the photoresist layer concentrically, etching through an exposed area of all layers of material and the organic release layer the until the silicon substrate is encountered on the bottom, removing the photoresist layer, releasing a structure from the substrate, and annealing thermally to decompose the polymer core to form the negative thermal expansion system device.

According to another aspect of the present invention provides a method for fabricating a NTEs devices comprising the steps coating a wafer with a thermally decomposable polymer, patterning the decomposable polymer into repeating disk patterns, releasing the decomposable polymer from the wafer and forming a sheet of repeating patterned disks, suspending the sheet of released patterned decomposable polymer into a first solution with seeding compounds for electroless decomposition, removing the sheet of released patterned decomposable polymer from the first solution, suspending the sheet of released patterned decomposable polymer into a second solution to electrolessly deposit a first layer material onto both sides of the sheet, wherein the sheet of released patterned decomposable polymer is held at a predetermined temperature, removing the sheet of released patterned decomposable polymer from the second solution, suspending the sheet of released patterned decomposable polymer into a third solution to deposit a second layer of material having a lower TCE value than the first layer of material onto both sides of the sheet of released patterned decomposable polymer, separating the patterned disks from one another, and annealing thermally the patterned disks to decompose the decomposable polymer and creating a cavity in place of the decomposable polymer.

In addition, the patterned disks may be separated by ultrasonic agitation, wherein the disks break at the narrow point in the finger between the disks exposing the decomposable polymer, and the polymer decomposes during the annealing process thereby completing the separation process. The patterned disks may also be separated by high shear mixing, wherein the disks break at the narrow point in the finger between the disks exposing the decomposable polymer, and the polymer decomposes during the annealing process thereby completing the separation process. Further, the pattern disks may be separated by stretching the sheet of patterned disks in both the x and y directions to crack the thin fingers between the disks and expose the decomposable polymer at the narrow point of the finger, and submersing the sheet of patterned disks into a suitable solvent to dissolve the decomposable polymer severs the ties between disks. Furthermore, the pattern disks may be separated by stretching the sheet of patterned disks in the direction 45 degrees to the x direction to crack the thin fingers between the disks and expose the decomposable polymer at the narrow point of the finger, and submersing the sheet of patterned disks into a suitable solvent to dissolve the decomposable polymer severs the ties between disks.

According to another aspect of the present invention provides a CTE compensated contact in a land grid array interposer comprising an interposer with a plurality of contact holes, and a plurality of contacts in the plurality of contact holes, wherein the contacts are formed by placing the plurality of NTEs devices within a matrix elastomer and forming the matrix elastomer with the plurality of NTEs devices into a desired shape.

According to another aspect of the present invention provides a (NTEs) device comprising a first layer of material, a second layer having a greater coefficient of thermal expansion (TCE) value than the first layer of material, a third layer of material having a TCE value the same as the second layer of material, wherein the second and third layers are joined together along a perimeter of the material, and a fourth layer of material having a TCE value the same as the first layer of material.

According to another aspect of the present invention provides a plurality of the NTEs devices may be joined together with a small amount of elasomeric adhesive directly instead of being incorporated into a host medium. This would produce a foam-like solid with a negative coefficient of thermal expansion.

According to another aspect of the present invention the NTEs device reacts to temperature changes where the volume cavity increases as the temperature of the device decreases below the predetermined temperature and the volume decreases as the temperature of the device increases to the predetermined temperature.

These and other embodiments, aspects, objects, features and advantages of the present invention will be described or become apparent from the following detailed description of the preferred embodiments, which is to be read in connection with the accompanying drawings.

BRIEF DESCRIPTION OF DRAWINGS

FIG. 5a-5f depict cross-sectional views illustrating another method of manufacturing a NTEs device, according to another embodiment of the present invention.

FIG. 7a-7b depict a top view of a plurality of NTEs devices, according to another embodiment of the present invention.

FIG. 13a illustrates a cross-sectional view of a high performance NTEs device with unconstrained bilayers, according to another embodiment of the present invention.

DETAILED DESCRIPTION OF PREFERRED EMBODIMENTS

Figure 1:
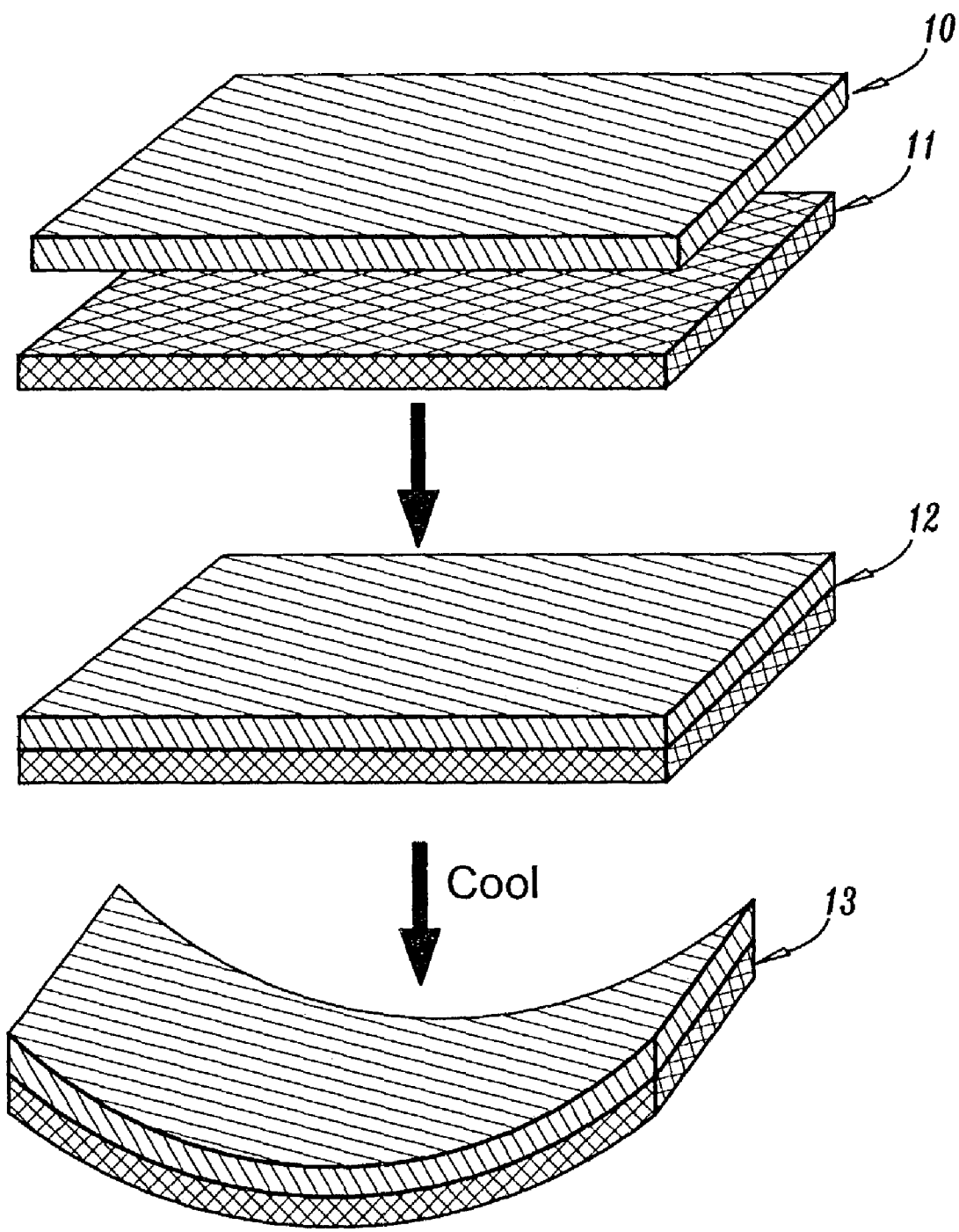
FIG. 1 depicts an exploded view of a conventional simple metal bilayer.

Preferred embodiments of the present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will convey the concept of the invention to those skilled in the art. In the drawings, the thickness of layers, regions, and devices are exaggerated for clarity.

According to a preferred embodiment of the present invention, miniature devices comprised of dual opposed bilayers of material where the two bilayers are attached to one another at the peripheral edges only, and where the bilayers themselves are at minimum stress conditions at a reference temperature defined by the temperature at which the bilayers were formed. These devices have the unusual and technologically useful property of volumetrically expanding upon lowering of temperature. These devices are scalable from large (for example 25 micron diameter) to very small (hundreds of nanometers) depending upon the lithographic and fabrication resolution available.

FIG. 1 depicts an exploded view of a simple metal bilayer, according to an embodiment of the present invention. In FIG. 1, a metal layer 10 is fused to metal layer 11 having a lower TCE value than metal layer 10 at a predetermined temperature. The result is a simple metal bilayer at the predetermined temperature 12 and a curled bilayer once it cools 13.

Figure 2A:
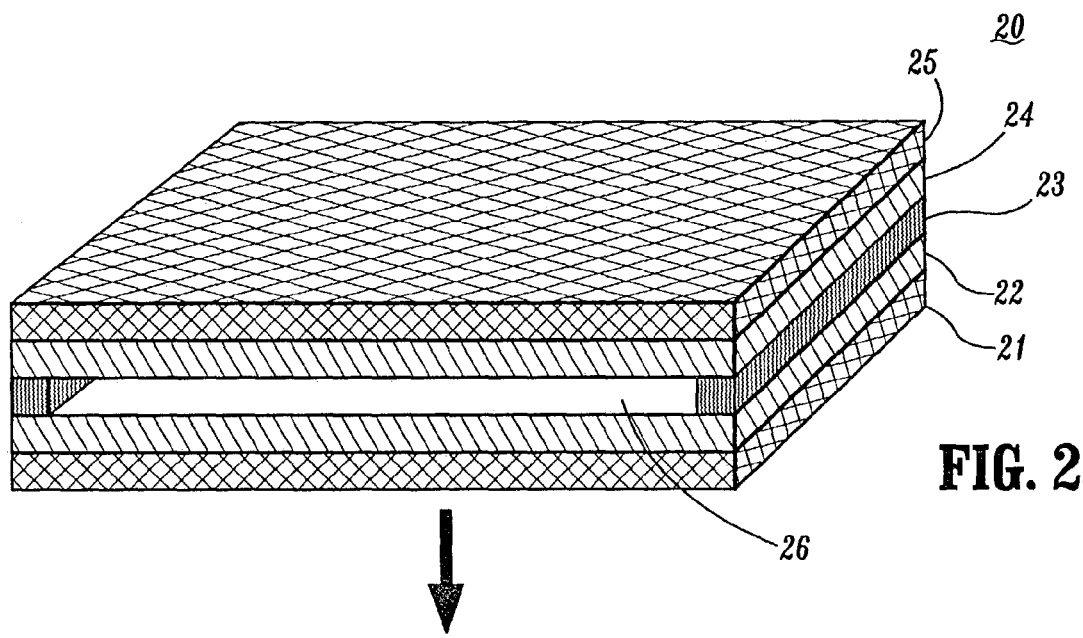
FIGS. 2a-2b depict a side isometric view of two simple metal bilayers joined together back-to-back (symmetrically oriented to each other) at the edges of the layers only to form a NTEs device, according to an embodiment of the present invention.
Figure 2B:
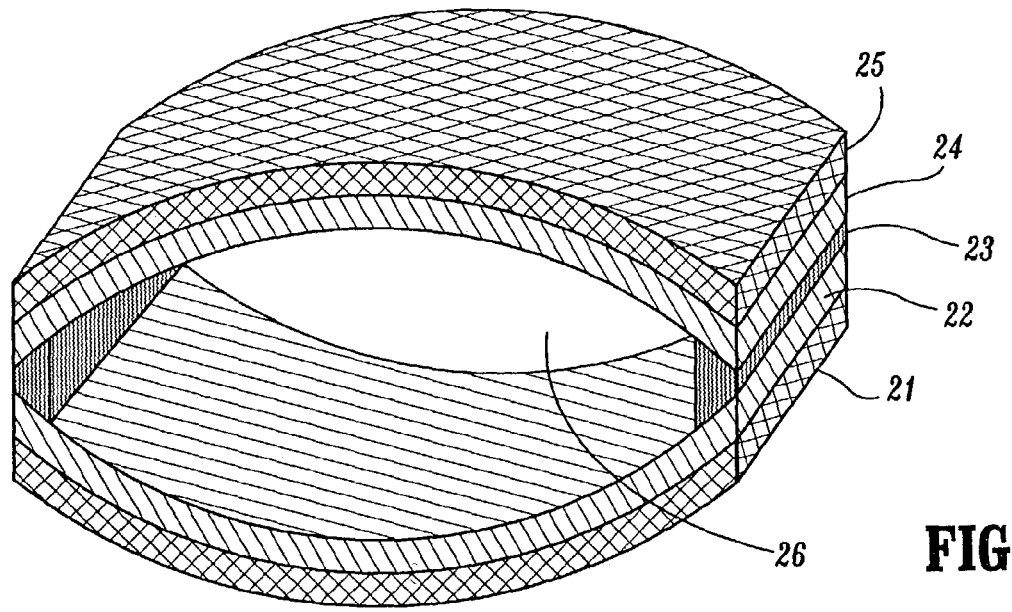

FIGS. 2a-2b depict a side isometric view of two simple bilayers joined together back-to-back (symmetrically oriented to each other) at the edges of the layers to form a Negative Thermal Expanding system (NTEs) device, according to an embodiment of the present invention. The NTEs device shown in FIGS. 2a and 2b are structurally identical but are shown as they appear at different temperatures. FIGS. 2a-2b illustrate NTEs device in both the unstressed form, as shown in FIG. 2a, and the stressed form, as shown in FIG. 2b. The NTEs device is unstressed when at a predetermined temperature, e.g. 100° C., and starts to stress as the temperature of the device falls below the predetermined temperature. Referring to FIG. 2a, a NTEs device 20 is shown having a first layer of material 21 connected to a second layer of material 22 having a higher TCE value than the first layer of material 21, an adhesion layer 23 connected to the perimeter of the second layer of material 22 thus forming the sidewalls of a cavity 26, a third layer of material 24 having the same TCE value as the second layer of material 22 is connected to the second layer of material 22 by the adhesion layer 23, and a forth layer of material 25 having the same TCE value as the first layer of material 21 is connected to the third layer material 24. The adhesion layer 23 may be of a variety of materials including a fine line adhesive, e.g. chromium, or another metal, e.g. titanium. In addition, the second layer of material 22 may be directly fused to the outer perimeter of the third layer of material 24, both layers 22 and 24 having the same TCE value, thereby forming a joint. Since the layers 22 and 24 are only connected at the outer perimeter of each layer, the remaining unjoined portion of the layers 22 and 24 are able to separate and flex thereby forming a cavity.

Figure 3A:
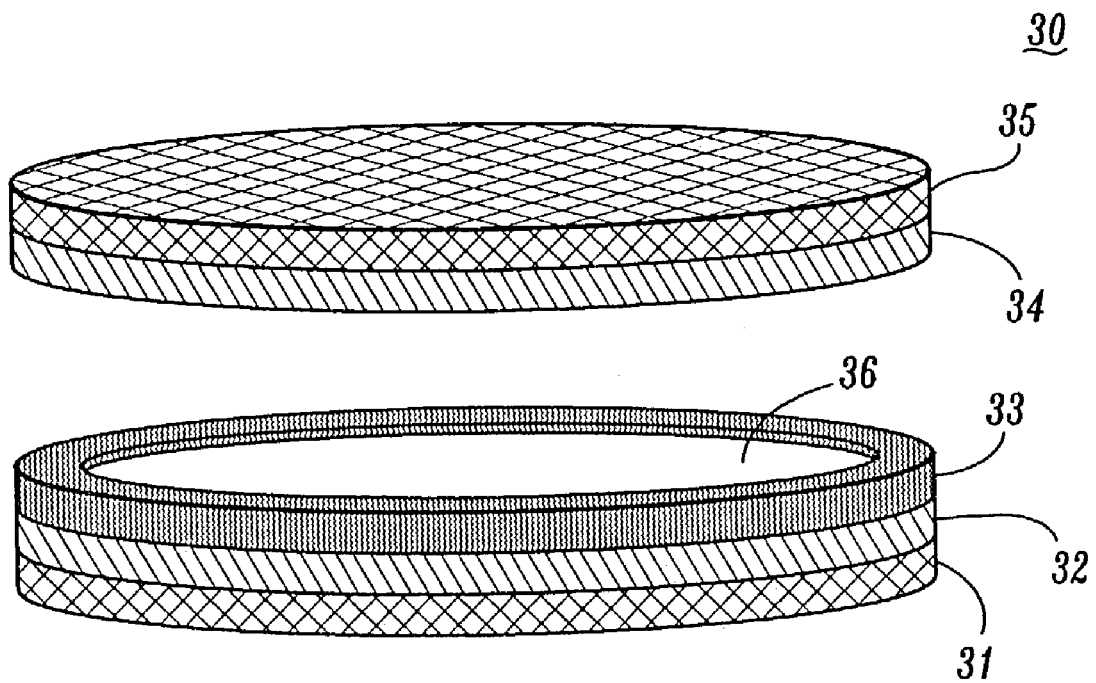
FIGS. 3a and 3b depict an exploded view of two simple fused bilayers joined to each other at the edges only to form a NTEs device, according to another embodiment of the present invention.
Figure 3B:
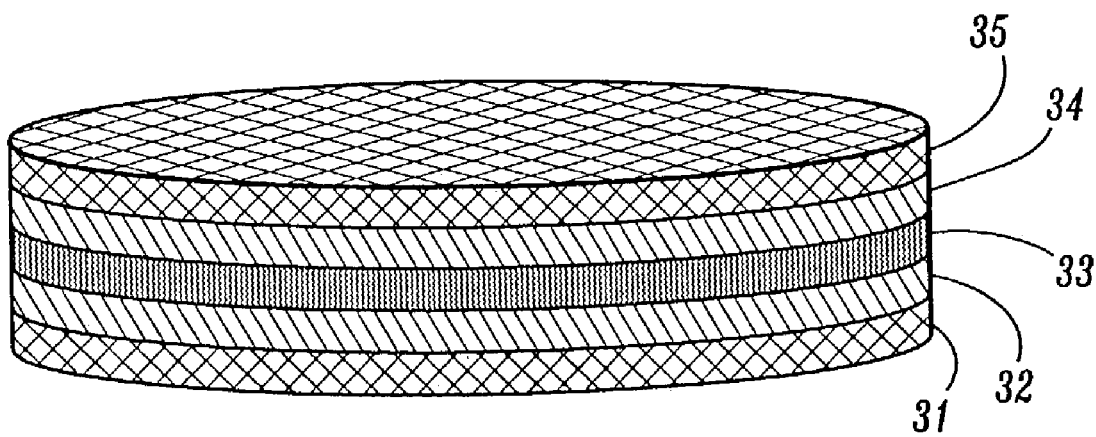
Figure 3C:
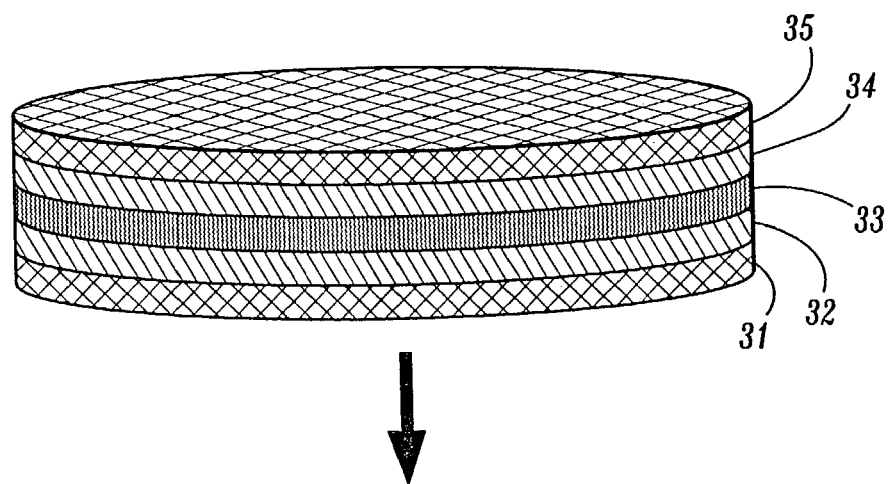
FIGS. 3c and 3d illustrate a NTEs device at different temperatures, according to another embodiment of the present invention.
Figure 3D:
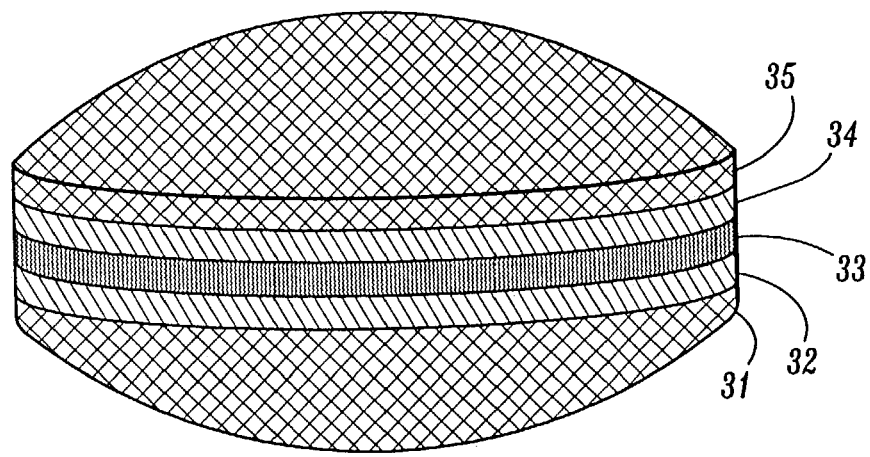

FIGS. 3a-3d are perspective views of a saucer type Negative Thermal Expanding system (NTEs) device, according to another embodiment of the present invention. FIGS. 3a-3d illustrate a saucer type NTEs device in both the unstressed form, as shown in FIGS. 3a, 3b, and 3c, and the stressed form, as shown in FIG. 3d. The NTEs device is unstressed when at a predetermined temperature, e.g. 100° C., and starts to stress as the temperature of the device falls below the predetermined temperature. Referring to FIGS. 3a and 3b, a NTEs device 30 is shown having a first layer material 31 connected to a second layer of material 32 having a greater TCE value than the first layer 31, an adhesion layer 33 connected to the perimeter of the second layer of material 32 thus forming the sidewalls of a cavity 36, a third layer material 34 having the same TCE value as the second layer 32 is connected to the second layer of material 32 by the adhesion layer 33, and a fourth layer of material 35 having the same TCE value as the first layer 31 is connected to the third layer of material 34. The Fabrication of NTEs device 30 could be precisely carried out in a fashion illustrated in FIG. 4 illustrating the sequential thin film deposition and etching steps.

Figure 4:
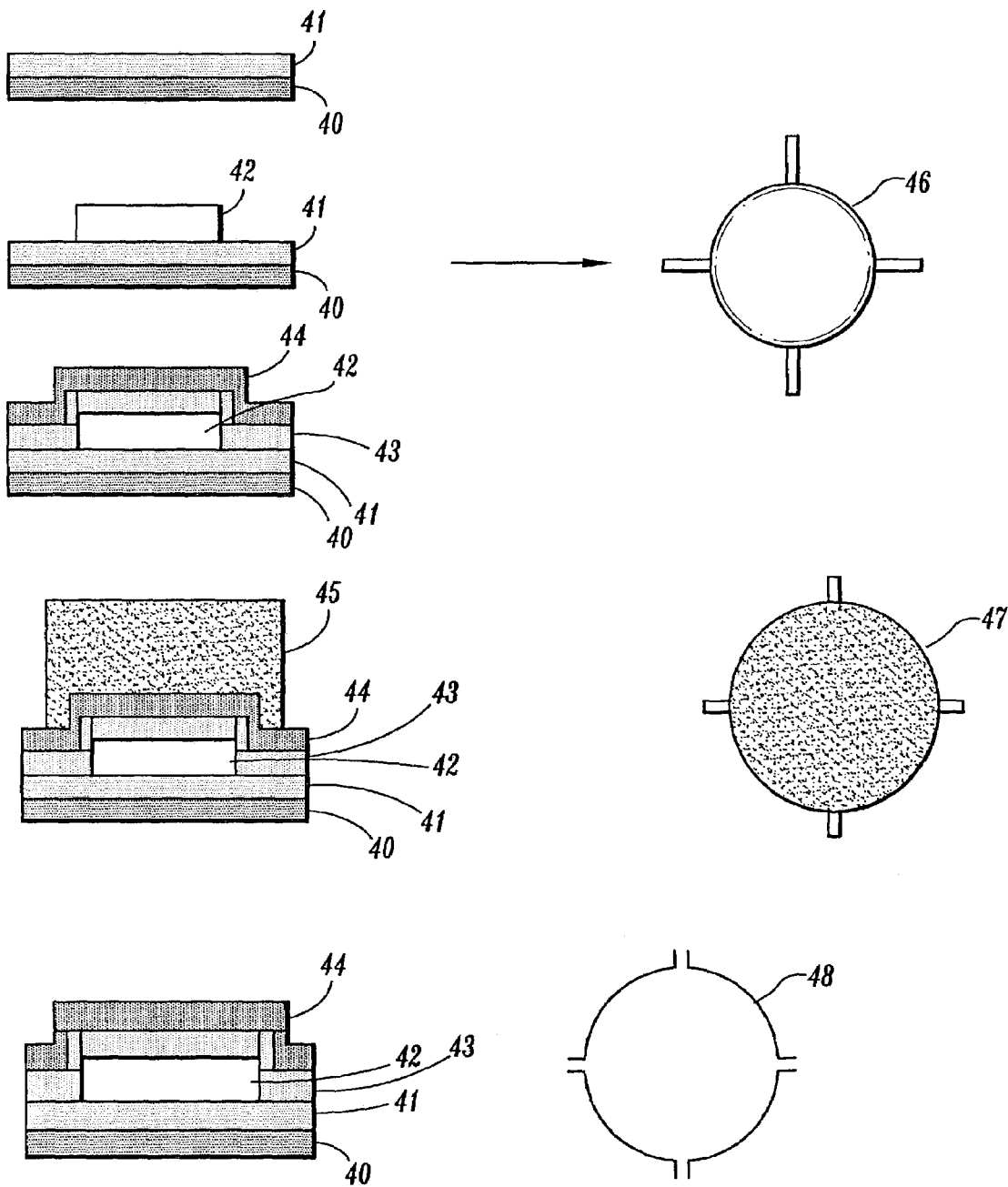
FIG. 4 depicts a cross-sectional view of a series of different stages of the fabrication of an NTEs device by one method, according to another embodiment of the present invention.

FIG. 4 depicts a cross-sectional view of a series of different stages of the fabrication of a NTEs device by one method of fabrication, according to another embodiment of the present invention. In FIG. 4, a silicon wafer (not shown) or other suitable temporary substrate is heated to a desired predetermined temperature such as 100° C. The desired predetermined temperature is chosen to be about the operating temperature of the final engineering application, e.g., a chip operating temperature. Once the desired temperature is reached, a thin film 40, e.g. about 2 um, of a material is blanket deposited by evaporation (or other methods such as CVD, sputtering, etc.). Next, a second layer of material 41 having a greater TCE value than the first layer of material 40 is deposited on top of the first layer of material 40, which has a lower TCE value than the second layer 41. Then, a polymer layer 41 consisting of a polymer type that will decompose or depolymerise at elevated anneal temperatures is deposited and patterned into disk shapes. One example of a polymer that is known to efficiently thermally depolymerize at convenient temperatures is a polymethyl methacrylate, PMMA. Further, the polymer type may be, but not limited to, polyalphamethylstyrene, polyphenyylene oxide, polyamide, polyimide, polyesters, polyurethanes, epoxies, photoresists of various types. Thus, using PMMA as an example, it would then be blanket coated on the second layer of material 41. Using either e-beam lithography to directly pattern it, or photolithography with photoresist steps or by other means, the PMMA is formed into disks with finger-like appendages radiating from the disk, as shown in FIG. 4, item 46, which is a top view. Next, a third layer of material 43 having the same TCE value as the second layer 41 is blanket deposited over the PMMA patterned disk 42 and the exposed portions of the second layer of material 41. Then, a forth layer of material 44 having the same TCE value as the first layer 40 is blanket deposited on the third layer of material 43. Next, on top of this structure, a thick photoresist 45, e.g. SU-8, is deposited on top of the structure. The photoresist 45 is lithographically patterned such that disk shapes of resist are left covering the PMMA disks 43 buried below and oriented concentrically to it. The photoresist 45 should be of a slightly larger diameter than the PMMA disk 43 but slightly smaller than the radiating fingers so that a small part of the finger projections are left un-covered. Then the wafer structure is etch, using reactive ion etching or ion milling, through the exposed areas of the four levels of metal 40, 41, 43, and 44 including the encased PMMA before the protected areas are affected, as shown in FIG. 4, item 47. The photoresist 45 is then removed from the disk structures. The disk structures are then released from the wafer and annealed thermally to decompose the polymer core to form a negative thermal expanding system (NTEs) device 48.

After the NTEs are formed by the above-described method, the NTEs devices are then ready for use. One example of an application is the formation of a composite consisting of a multitude of these NTEs devices mixed with the precursor components (or the melt) of an elastomeric or rubber material (e.g., a siloxane rubber). If the NTEs were mixed in a suitably large volume fraction, then the overall net TCE of the resulting rubber composite would be lower than it would be without the NTEs. Indeed, if enough of the NTEs were mixed in, the overall TCE could be rendered near zero or even into net negative values. Even a reduction in the composite TCE would offer significant technological advantage.

Figure 5A:
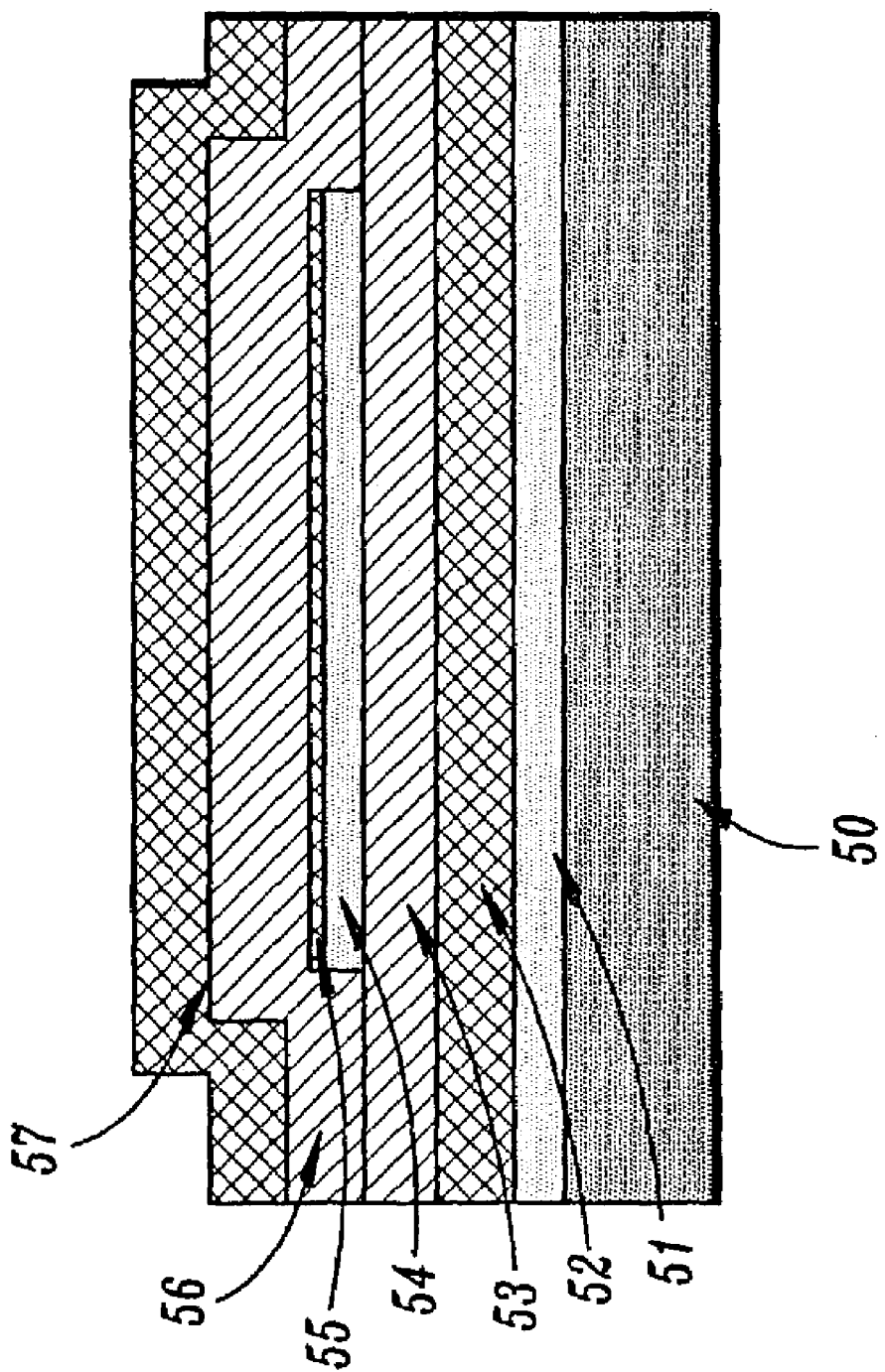

FIGS. 5a-5d depict various cross-sectional views of another negative thermal expanding system (NTEs) device along the manufacturing process in which the films are deposited sequentially and lithography defined, according to another embodiment of the present invention. Referring to FIG. 5a, depicts a NTEs device on a silicon wafer 50. The NTEs device is composed of a lower organic layer 51 (which will disappear upon later annealing), a first layer of material 52 deposited on the organic layer 50, a second layer of material 53 having a greater TCE value then the first layer 52 is deposited on the first layer 52, a second organic layer 54, e.g. DLC material or PMMA etc, deposited on the second layer 53, a layer of Organic hard mask 55 is deposited on the organic layer 54 wherein the organic layer 54 and the hardmask 55 are pattern into disk shapes as shown in FIG. 4, item 46, a third layer of material 56 having the same TCE value as the second layer 53 is deposited on the optional organic hard mask 55 and the exposed portion of the first high TCE material 53, and a second layer of Low TCE material 57 is deposited on the second layer of high TCE material 56.

In Reference to FIGS. 5b and 5c, depicts a cross-section view of a negative thermal expanding device during manufacturing of the device, according to one aspect of the present invention. As shown therein, a substrate 50, a first Organic layer 51 deposited on the substrate, a first layer of material 52 is deposited on the first organic layer 51, a second layer of material 53 having a greater TCE value than the first layer 52 is deposited on the first layer of material 52, a second organic layer 54 is deposited on the second layer of material 53, an optional layer of organic hard mask 55 is deposited on the second layer of organic layer 54, and resist layer 59a is deposited on the organic hard mask 55 and patterned to define the x-y size of the cavity. Next, the structure is introduced into an etching environment such as reactive ion etching (RIE) which etches the hard mask and the resist (59a) until the exposed portions of the hardmask are etched away. Then etching continues into the exposed organic layer and the resist (59a) until the organic layer is etched away. The resist layer (59a) is now thinner but still is present. It is then removed by another method (such as by solvent or commercial resist stripper) that does not affect any other portion of the structure. FIG. 5c is what results, and it is now ready for blanket deposition of layer 56 followed by 57.

Figure 5D:
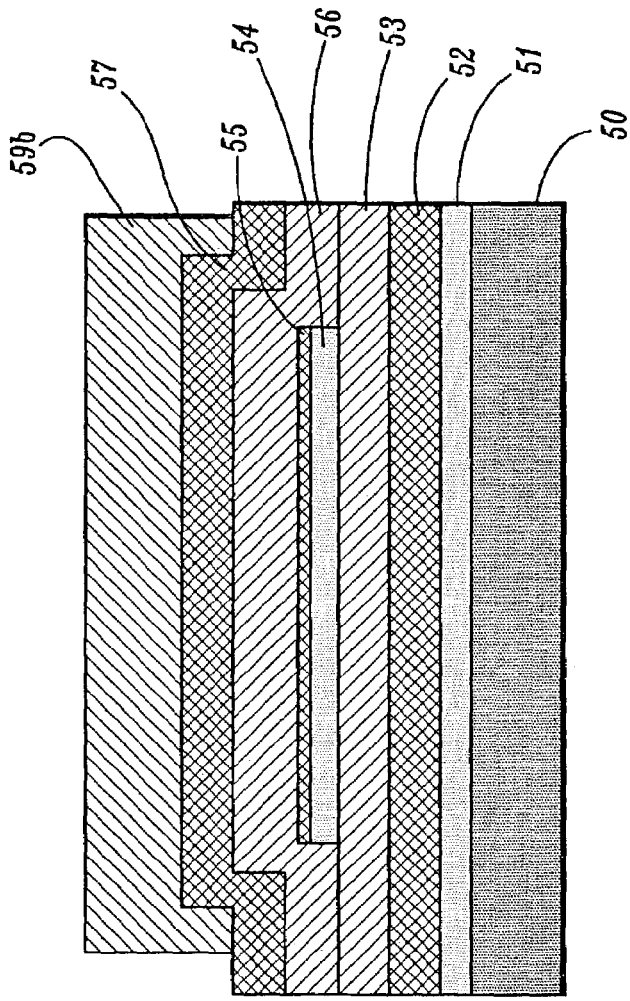
Figure 5E:
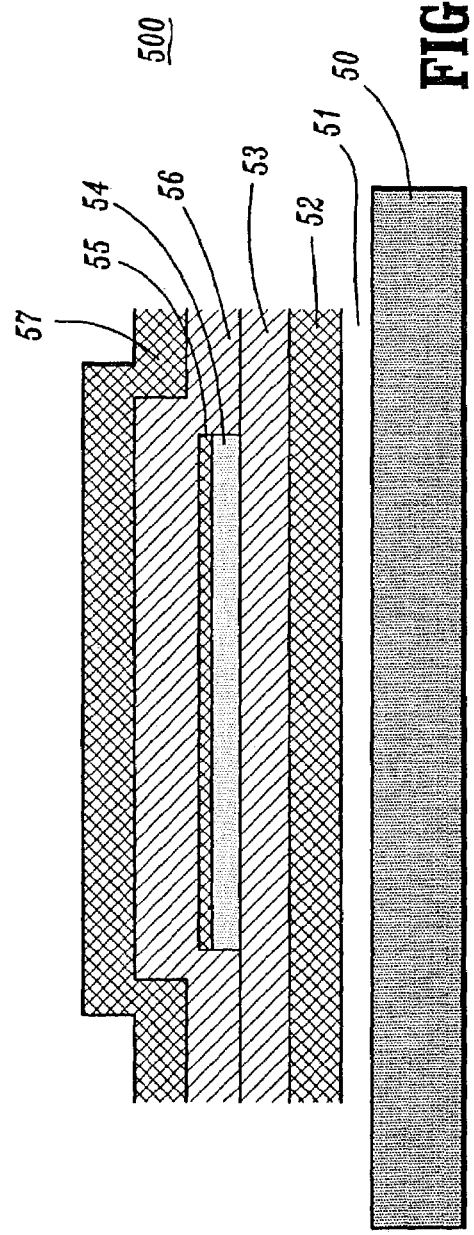
Figure 5F:
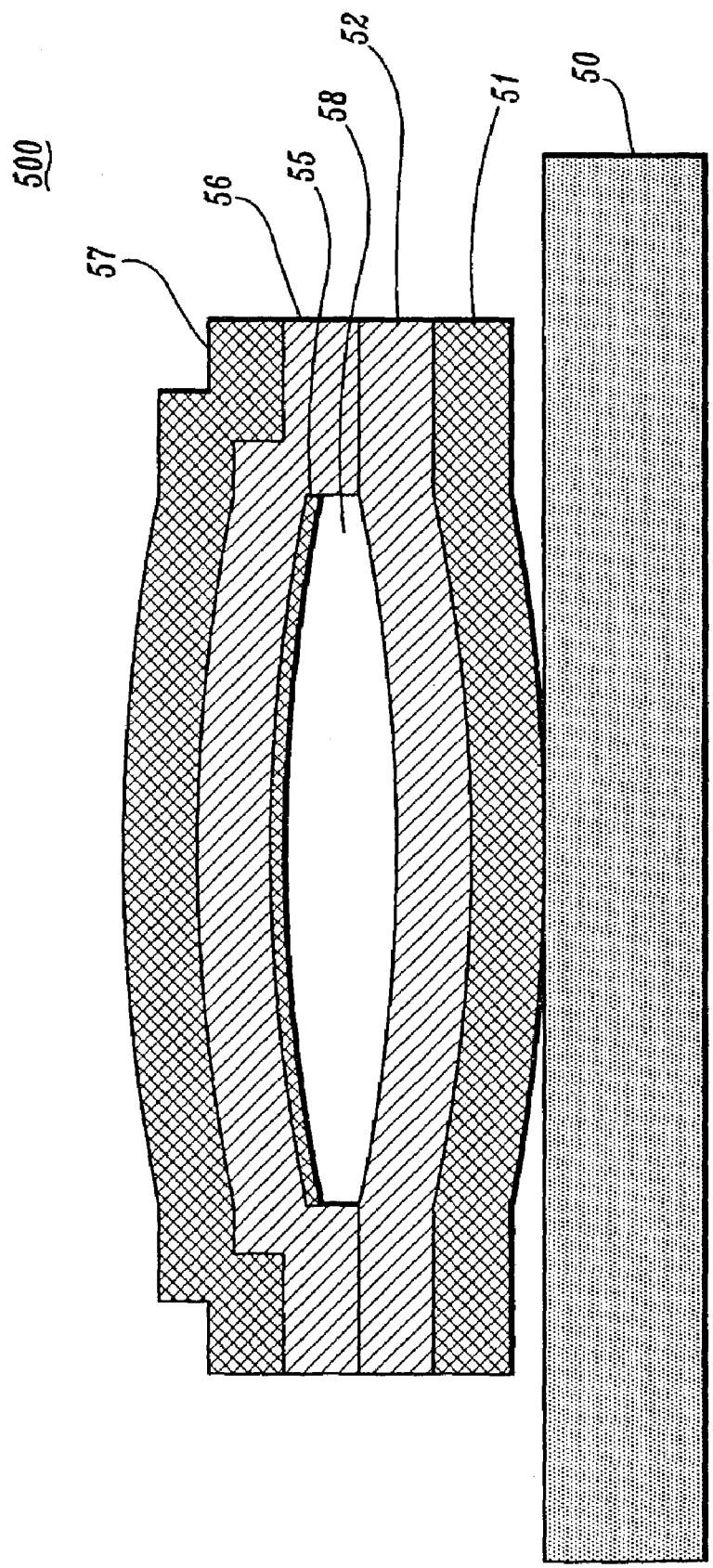

In FIGS. 5d-5e, depicts the cross-sectional view of a NTEs device during a portion of the process. As shown therein, after the x-y size of the cavity is defined, A third layer of material 56 having the same TCE value as the second layer 53 is deposited onto the cavity forming materials (the second organic layer 54 and the organic hard mask 55), a layer of low TCE material 57 is deposited on the layer of high TCE material 56. Then a second layer of resist 59b is deposited and patterned onto the low TCE material 57. In FIG. 5e, illustrates a cross-sectional view of a NTEs device after the all the layers have etched away including organic layer 51 and the second resist layer has been removed, according to another embodiment of the present invention. FIG. 5f, illustrates a cross-sectional view of a completed NTEs device. Also implied, but not shown are fingers extending radially out as in shown in FIG. 4, item 46, which will provide pipe-like structure for the release of gas formed in a subsequent organic decomposition step. Referring to FIGS. 5b-5f, an exemplary method of manufacturing a negative thermal expanding device is as follows: An organic release layer 51 is blanket deposited onto a silicon wafer 50 or other suitable temporary substrate and is heated to a desired reference temperature such as 100° C. (This temperature is chosen to be close to the operating temperature of the final engineering application. e.g., a chip operating temperature). The organic layer 51 may be spin coated, or evaporated, or sprayed, or laminated, or coated by any other means onto the substrate 50. The organic release layer may be either PMMA, alphamethyl styrene, polyphenyleneoxide, diamond-like-carbon (DLC), or any other like material. Next, a first layer of material 52, e.g. quartz ($SiO_2$), is blanket deposited on to the organic released layer 51. Note, an adhesion layer may be needed for a particular material. The adhesion layer is very thin so as not to significantly affect the mechanical operation of the device, e.g., an adhesive layer may be 200 angstroms of chromium or titanium. The adhesion layer may be applied by vacuum evaporation, vacuum sputtering, spin coating or spray coating or any other suitable methods. This would improve adhesion without introducing significant mechanical affects to the device because it is so thin. Similarly between any layers as needed. Next, a second layer of material 53, e.g. aluminum, having a greater TCE value than the first layer of material 52 is deposited onto the first layer of material 52. Then, an organic layer 54, e.g. DLC, consisting of a polymer type that will decompose or depolymerise at elevated anneal temperatures is deposited and patterned into disk shapes with finger-like appendages radiating from the disk, as shown in FIG. 4, item 46. Next, an optional organic hard mask 55 may be deposited and patterned into disk shapes onto the organic layer 54. Next, a third layer of material 56 having a TCE value the same as the second layer of material 53 is blanket deposited over the DLC layer 54 and Organic mask layer 55, if present. Then, a forth layer of material 57 having the same TCE value as the first layer 52 is blanket deposited onto the material layer 57. On top of this structure then is deposited a thick photoresist 59b, such as SU-8. The photoresist is lithographically patterned such that disk shapes of resist are left covering the organic disks (DLC, PMMA, SiLK, polyalphamethylstyrene, polyphenylene oxide, polyamide, polyesters, polyurethanes, epoxies, photoresists of various types, or any other like material) buried below and oriented concentrically to it. It should be of a slightly larger diameter than the organic disk but slightly smaller diameter than the projecting fingers so that a small part of the finger projections are left uncovered. Then, reactive ion etching, or ion milling the wafer structure will etch through the exposed areas of all levels of material 51,52,54 (fingers only), 55 (fingers only), 56, and 57 before the protected areas are affected. The SU-8 resist 59b is then removed in a way that does not etch or damage any remaining parts or materials. The disk structures are then released from the wafer by annealing thermally to decompose the organic (PMMA, DLC, SiLK, polymer, polyalphamethylstyrene, polyphenylene oxide, polyamide, polyesters, polyurethanes, epoxies, photoresists of various types, or any other like material) core and the organic bottom layer 51 to form a micro expanding device 500. The released NTEs is shown in FIG. 5F sitting on but not adhered to the silicon substrate 50. It is shown in the stressed state it would acquire when cooled to a temperature (for example, room temperature) below the processing temperature (for example, 100 deg. C.).

Figure 6:
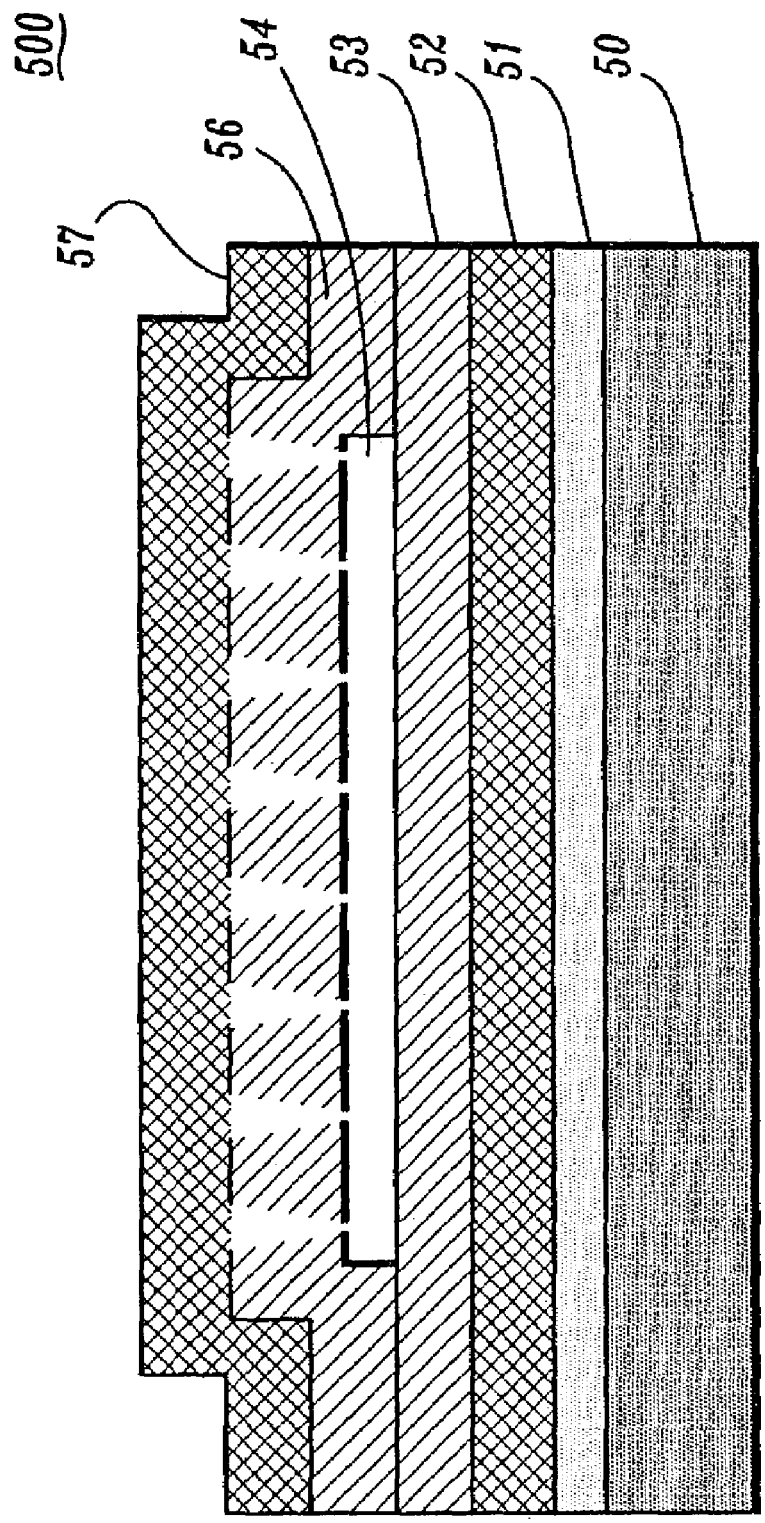
FIG. 6 depicts a cross-sectional view of a NTEs device, according to another embodiment of the present invention.

FIG. 6 is a cross-sectional view of a negative expanding device, according to another embodiment of the present invention. Referring to FIG. 6, the method steps of fabricating the NTEs device remains essentially the same as explained above in reference to FIGS. 5a-5e with added feature that vent holes (or vias) are formed in the second layer of high TCE material 56. This requires additional photolithography and etching steps. More specifically, after the third layer of material 56 is deposited, the layer is then patterned and vias are formed in the third layer material 56. Thus, the vent holes are made perpendicular to the plane of the wafer and offer a way to create the internal void (or cavity) by thermal decomposition just prior to depositing the final thin film layer, the forth layer of material 57. Thus, the fourth layer of material 57 closes these vent holes to provide an empty vacuum evacuated chamber in the final NTEs. Preferably, the second layer of high TCE material 56 is of a thickness of about 1 to 2 um, and the sacrificial cavity material may be photosensitive polyimide (PSPI), DLC, PMMA, or any other suitable material, and the gap in the cavity may be larger than the embodiment described above in reference to FIGS. 5a-5f (e.g. 1000 nm compared to 100 nm). In addition, preferably, the pressure in the cavity should be about 3 torr, but this is not necessary or even desired. It is only typical of expected pressure when fabricated in this way. Additionally, the organic layer 51 must be made of a different material than the material used in forming the cavity so that the device will not be released from the substrate during the process the cavity is being evacuated. For instance, the organic 54 should depolymerise at a lower temperature than organic layer 51 so the two steps can be done at different times. For example, the second organic layer 54 may be PMMA and organic layer 51 may be DLC.

Figure 7B:
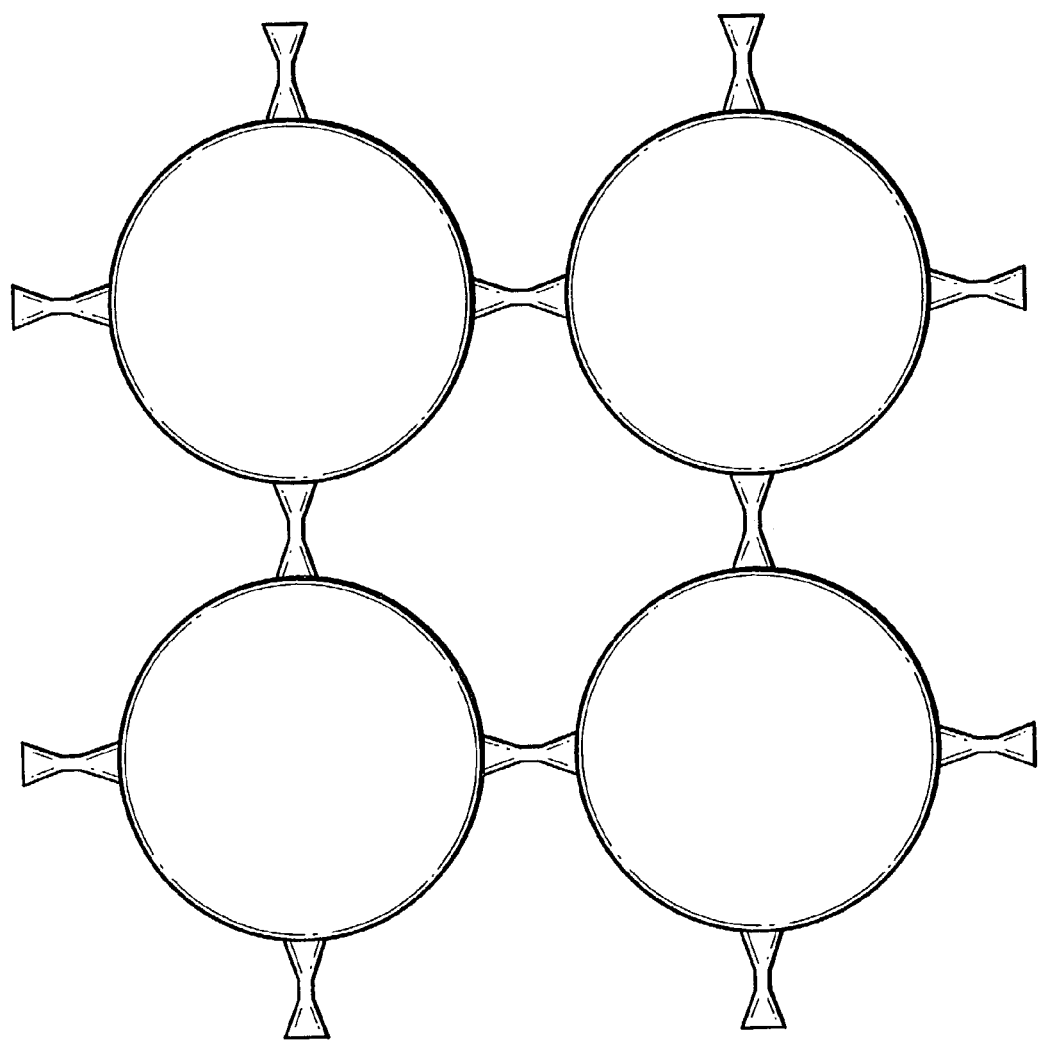
Figure 7C:
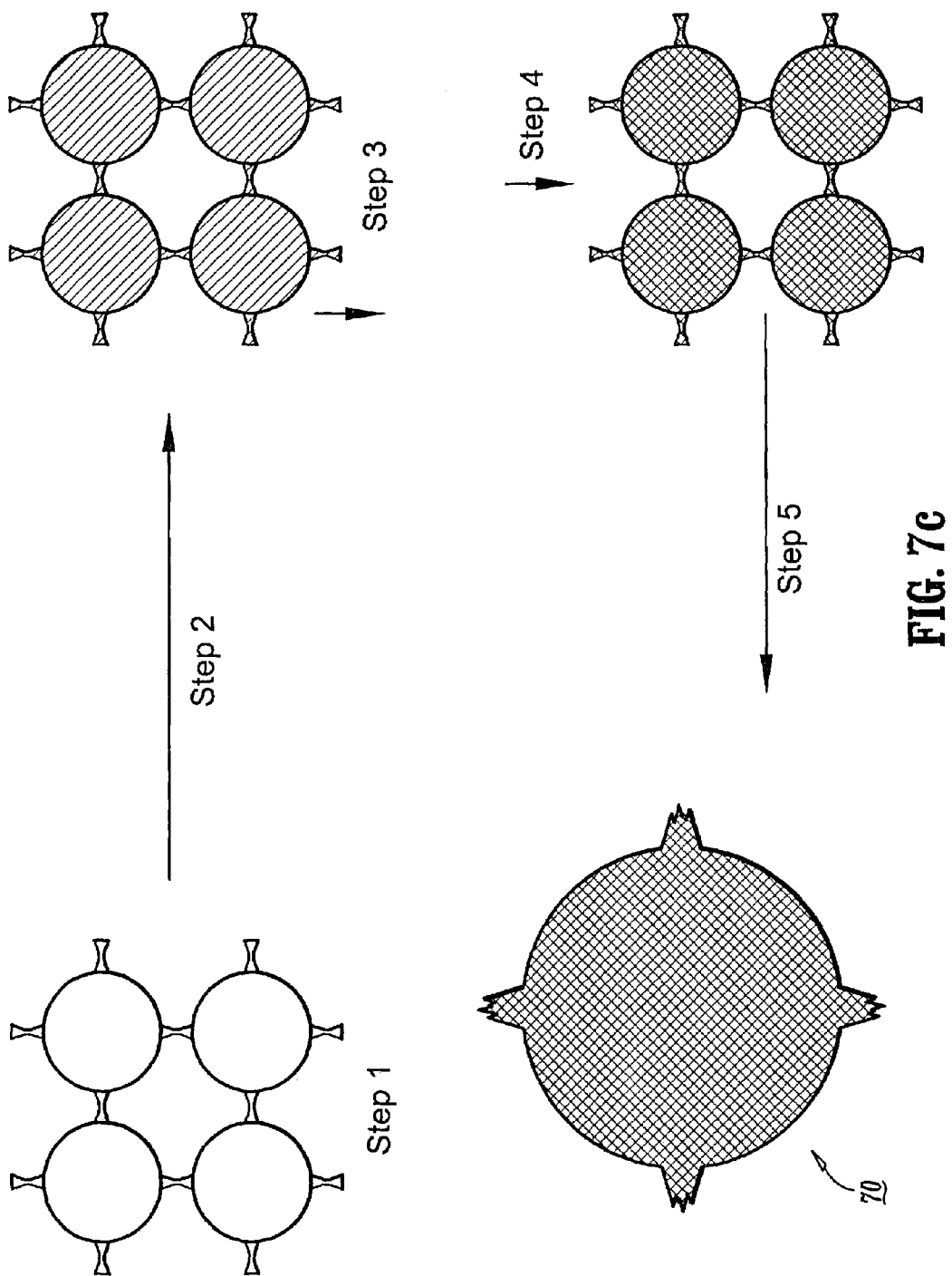
FIG. 7c depicts a series of sequential top views illustrating another fabrication method for the NTEs devices, according to another embodiment of the present invention.

FIGS. 7a-7c illustrate a top view of a plurality of negative expanding devices in a repeating disk pattern separated by fingers which taper to a narrow point between the disks on a wafer. Referring to FIG. 7a, depicts a top view of a wafer having a plurality of NTEs devices pattern on the wafer. Referring to FIG. 7a, illustrates a portional top view of a plurality of NTEs devices on a wafer. In making these patterns, the wafer is coated with a thermally decomposable polymer, e.g. PMMA, alphamethypolystyrene, polyphenylene oxide, or some other thermally decomposable polymer which are lithography definable. Preferably, the disks are about 10 um in diameter, and the fingers separating the disk are about 2 um wide at the base of the finger and about 0.5 um at the narrow portion of the finger.

Figure 7D:
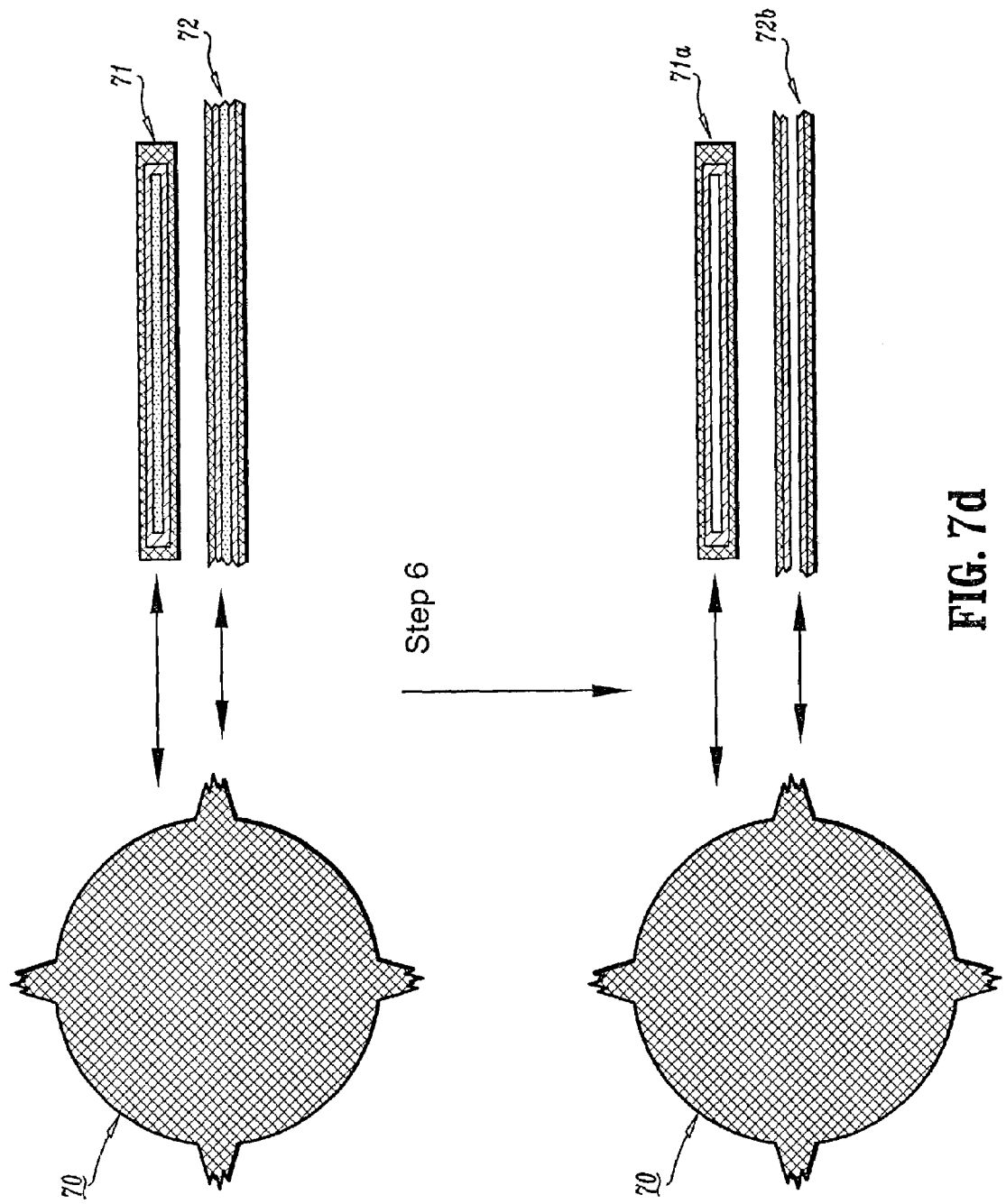
FIG. 7d depicts both top and profile views of the last two stages of fabrication by the method of 7c-7d.

FIG. 7c depicts a series of sequential plan views illustrating a fabrication method for making NTEs devices. A wafer is coated with a thermally decomposable polymer like PMMA and patterned by e-beam or photolithography (or by other means) into a repeating pattern of disks separated by fingers which taper to a narrow point in between disks (Step 1). Once patterned in this way, the decomposable polymer sheet is released from the wafer and suspended into a liquid solution with seeding compounds for electroless deposition, e.g. coat with Pd seed compound or sputter deposit monolayer of metal seed (Step 2). The sheet is then removed to another fluid (or solution), which is held at a predetermined temperature so the metal is plated at that temperature, e.g. 100° C., to electrolessly deposit a layer of metal having a greater TCE value than the next layer of metal being deposited (or any other high TCE material) Step 3. The sheet is then removed to another bath to deposit another layer of metal (or other low TCE material) having a lower TCE value than the above layer of metal deposited in step 3 by either electroless or electrodeposition (Step 4). Again, the plating bath should be held at the predetermined temperature. Alternatively, the pattern sheets could be sputter deposited on both sides with a first material followed by a sputter deposit on both sides with a second material having a lower TCE value than the first material. Still again, both depositions being done at the same predetermined temperature. Once removed, the disks are separated from one another by mechanical means such as ultrasonic agitation or high sheer mixer (Step 5). The NTEs would break at the narrow weak point. Since broken or torn at this narrow point, the polymer layer inside is exposed in this small cross-section, as shown in FIG. 7d, items 71 and 72, so that during the annealing process the polymer decomposes thereby emptying the inside space of the disks. The NTEs are then thermally annealed as shown in FIG. 7d to decompose the internal polymer (Step 6), and the NTEs are formed having a hollow cavity in the center of the device, as shown in FIG. 7d, items 71a and 71b. The resulting gasses from the decomposition would be exhausted through the open vent fingers. The vents are important to prevent rupture of the NTEs devices from excess pressure buildup during the annealing process. Even if rupture were avoidable, the trapping of gasses could prevent efficient contraction of the NTEs device when desired.

Figure 8A:
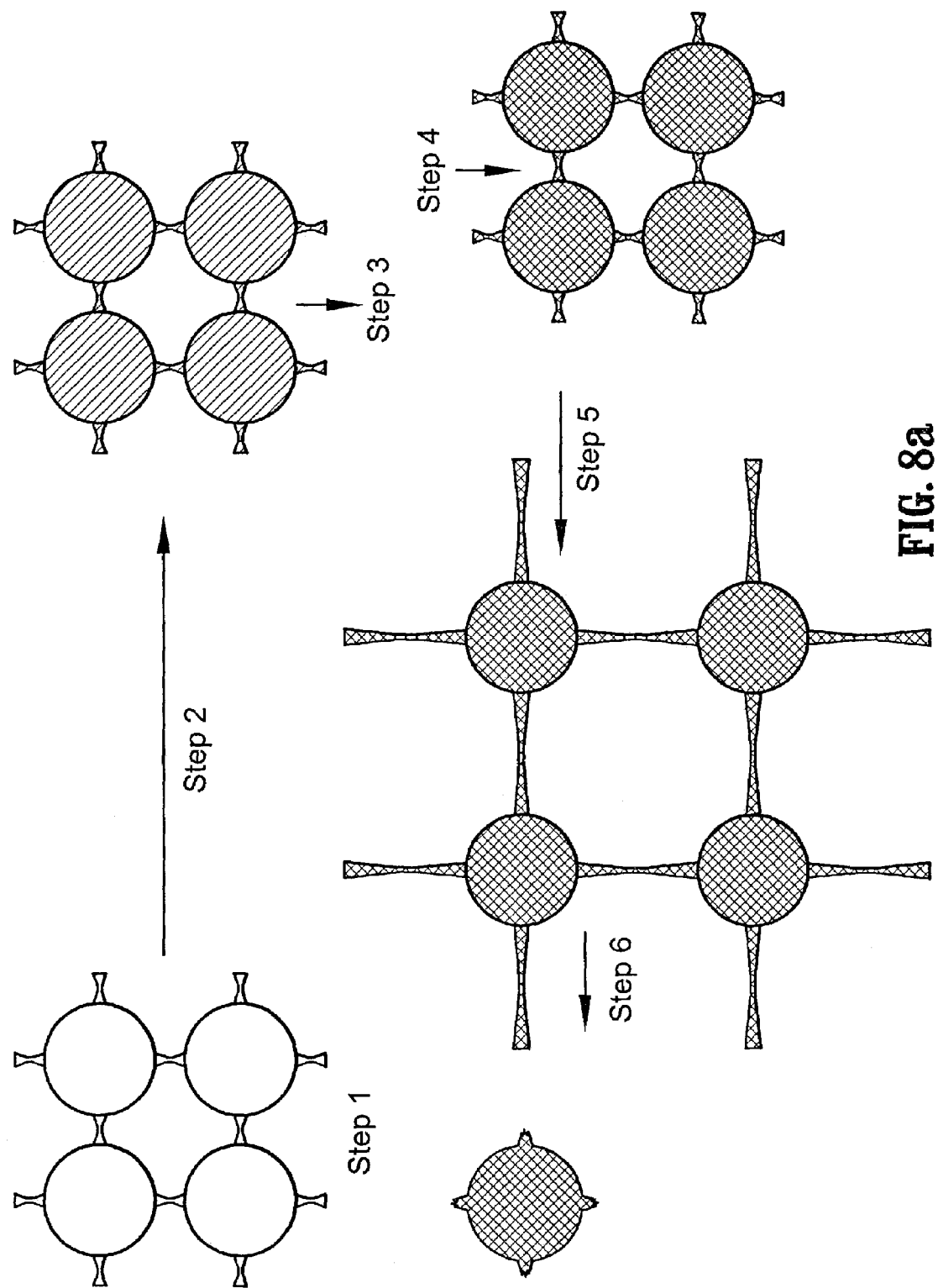
FIGS. 8a-8b depict a series of sequential top views illustrating a fabrication method for the NTEs devices, according to another embodiment of the present invention.
Figure 8B:
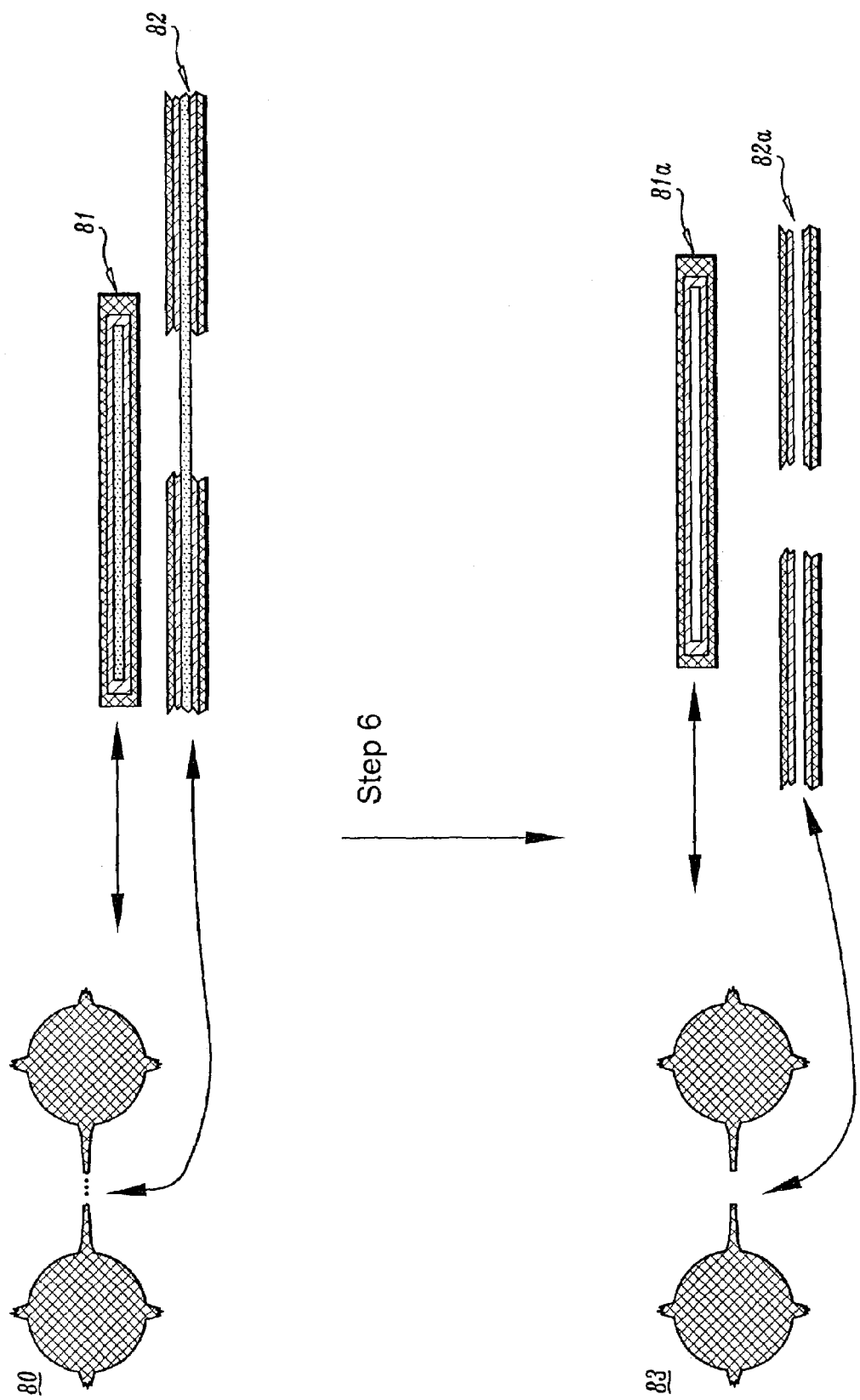
Figure 9:
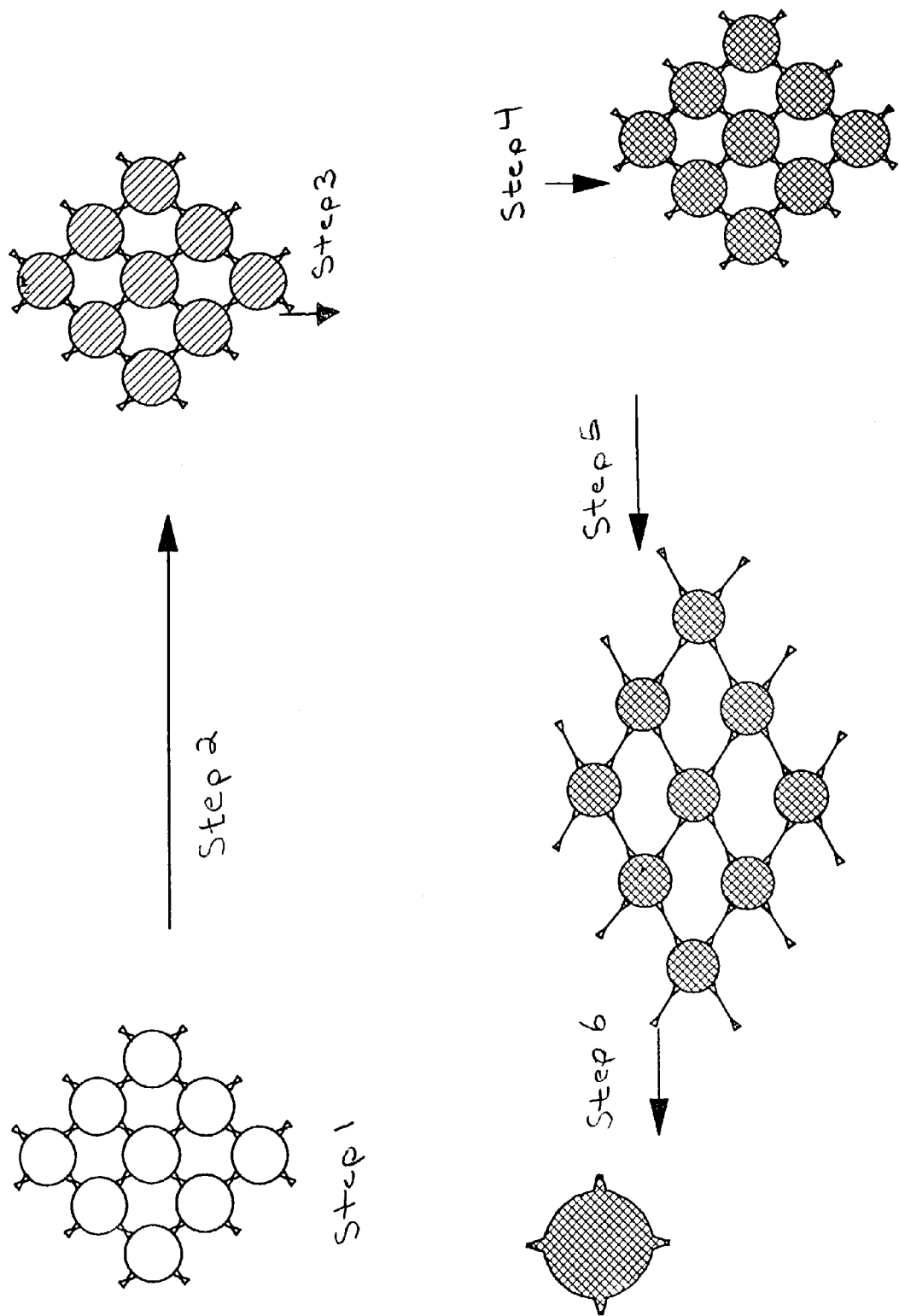
FIG. 9 illustrates a top view of a plurality of a NTEs device being separated, according to an embodiment of the present invention.

FIGS. 8a and 8b are sequential plan view illustrating a fabrication method in much the same way as the previous case of FIGS. 7a through 7d with a change in the method by which the metallized sheets are disassembled into discrete disks. The steps 1-4 as stated above are repeated. In this embodiment, the metallized sheets are mechanically stretched in both the x and y directions to impart an elongation of the thin fingers between the disks, as shown in FIG. 8a, or stretch mechanically in direction 45 degree orientation to the x (and y) direction only to elongate narrow vent tubes, and the decomposable polymer is exposed at the narrow point of the finger, as shown in FIG. 9 representing another embodiment of the present invention. The elongation and mechanical yielding takes place primarily or solely at the weak narrow points. The weak narrow points of the fingers crack and expose the decomposable polymer core. This is because the metal layers will crack and not plastically deform like the polymer layers. Once the decomposable polymer is exposed, then the sheet is submersed into a suitable solvent to dissolve the decomposable polymer and sever the ties between disks. Alternatively, the solvent step may be bypassed and the sheet moves on to the annealing process which will burn out the polymer and simultaneously discretize the disks. If the solvent step is used, then in a subsequent step, the NTEs are thermally annealed to depolymerise the polymer core. Referring to FIG. 8b, while some of the polymer core will be dissolved away by the solvent, in all likelihood this will only penetrate a short distance into the vent tube. FIG. 8b depicts a plurality of NTEs device before and after the separating step. More specifically, FIG. 8b illustrates the break in the narrow portion of the finger separating the NTEs devices before (80, 81, 82) and after (83, 81a, 82a) the thermal annealing process (step 6). In FIG. 8b there are two ways to perform step 6. One is with the use of a solvent, if the solvent step is used, then step 6 as shown is actually two steps, a solvent step and a thermal anneal step. The second way is if no solvent step is used and only the thermal anneal step is used to complete step 6 as shown in FIG. 8b. In addition, a cross-sectional view of a NTEs device is shown anywhere except at the vent utters with the decomposable polymer inside the cavity 81 and at the vent utters showing the elongation of the decomposable polymer 82 prior to the annealing process. After the annealing process is completed (step 6 to give 83), the cross-sectional view 81a illustrates the hollow cavity of the NTEs device enclosed on all sides except at the vent, as shown in item 82a. The thermal anneal process is still necessary to decompose the bulk of the polymer core and form the cavity inside as illustrated in FIG. 8b.

FIG. 9 illustrates an alternative method to separate the NTEs devices on a sheet, according to another embodiment of the present invention. Referring to FIG. 9, the sheet of NTEs devices is stretched mechanically in the direction 45 degrees to the x (and simultaneously they direction) only to elongate (in a single stretch) narrow vent tubes, and the decomposable polymer is exposed at the narrow point of the finger. Once the decomposable polymer is exposed, the sheet is submersed into a suitable solvent to dissolve the decomposable polymer severs the ties between disks. Alternatively, the solvent step may be bypassed and the sheet moves on to the annealing process which will burn out the polymer and discretize the disks.

Figure 10:
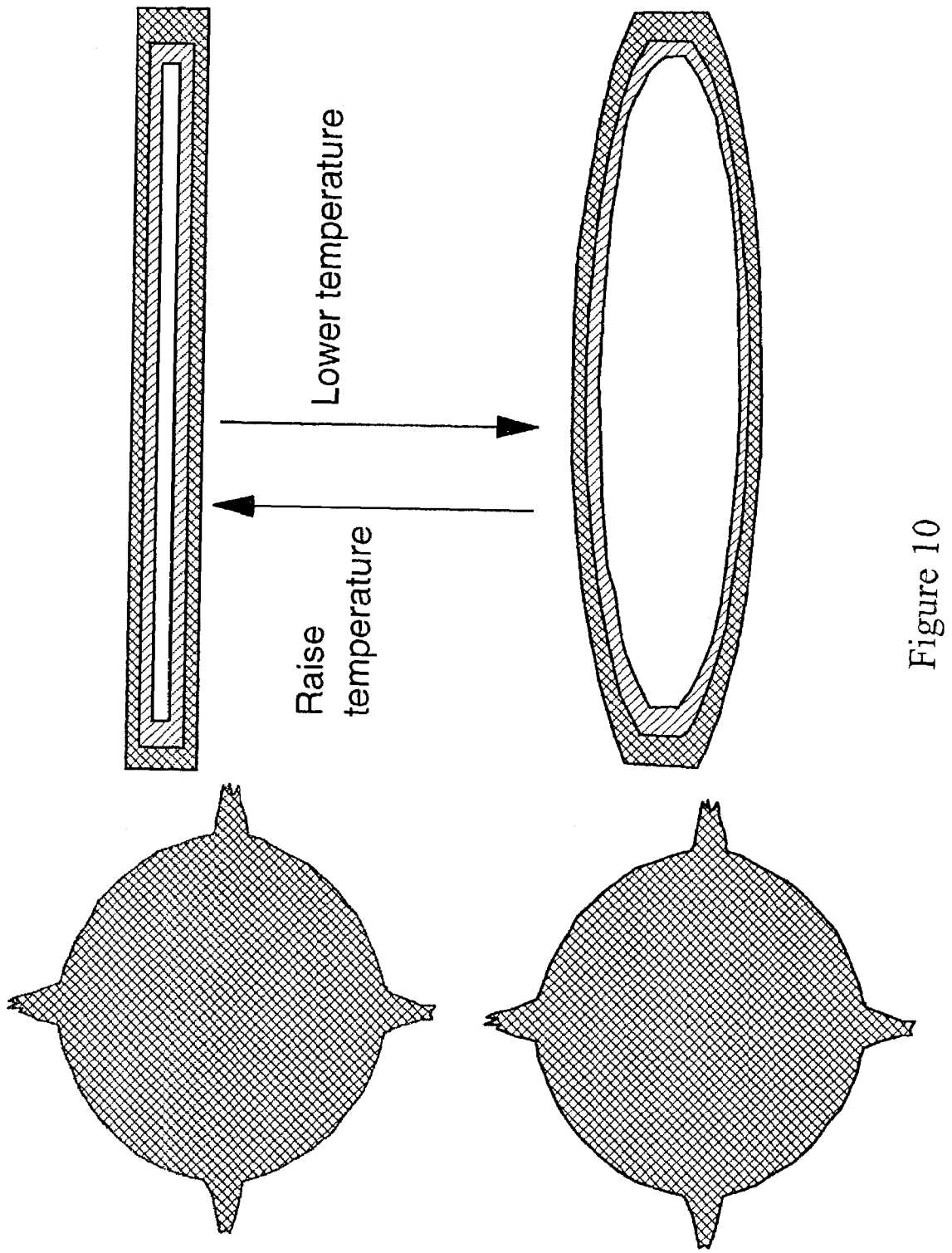
FIGS. 10-11 illustrate top views, cross-section views, and perspective views of one type of completed NTEs device.

FIG. 10 illustrates a top view and cross-sectional view of NTEs device after all fabrication steps are completed. Referring to FIG. 10, illustrates the working of the NTEs device reacting to temperature changes. As shown in FIG. 10, the NTE's cavity increases in volume as the temperature decreases below the predetermined processing temperature, e.g. 100° C., and NTE's cavity decreases in volume as the device temperature increases. Since this is the reverse of how most pure materials behave, it has significant technological utility.

Figure 11:
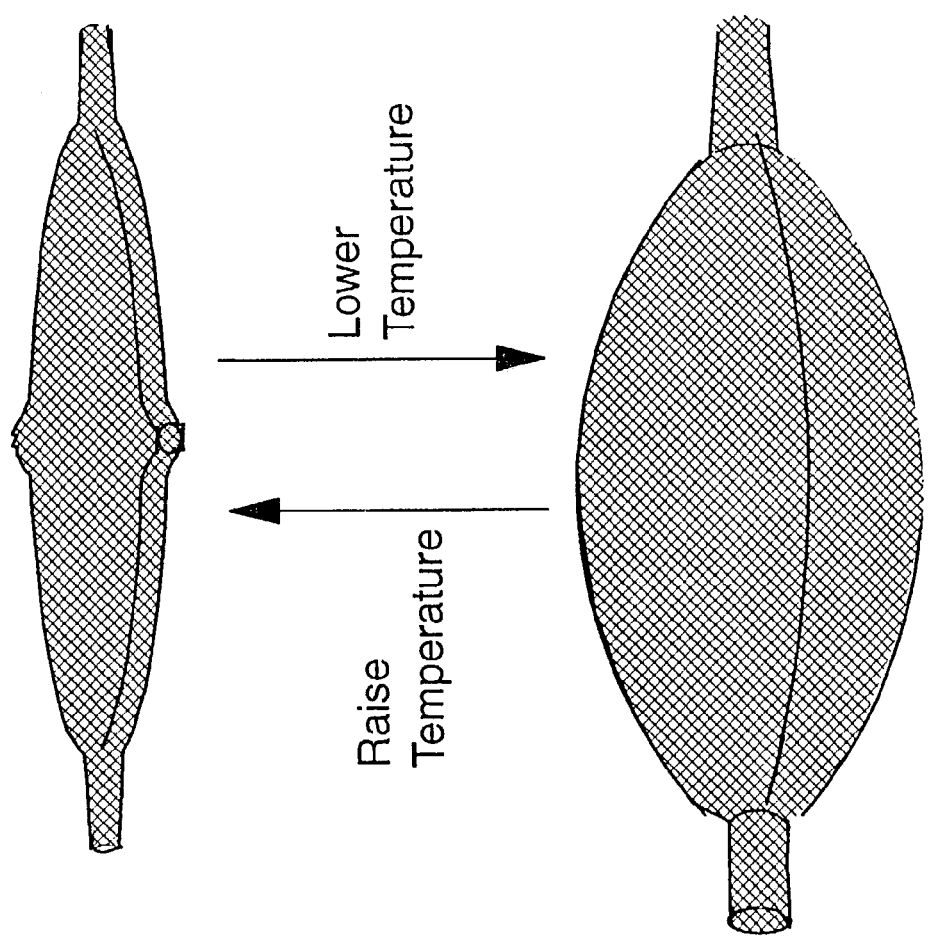

FIG. 11 is a perspective view of a NTEs device, according to an embodiment of the present invention. As shown in FIG. 11, the NTEs' cavity volume increases as the temperature of the device decreases, and the NTEs' cavity volume decreases as the temperature of the device increases.

Figure 12A:
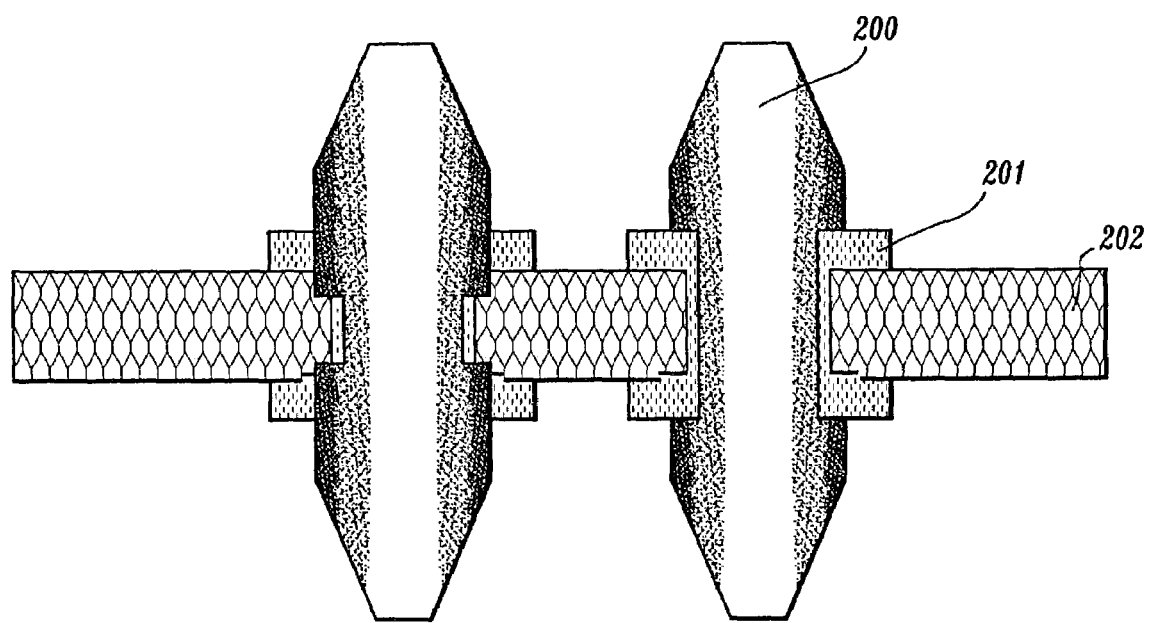
FIG. 12a illustrates a portional cross-sectional view of a typical LGA interposer.
Figure 12B:
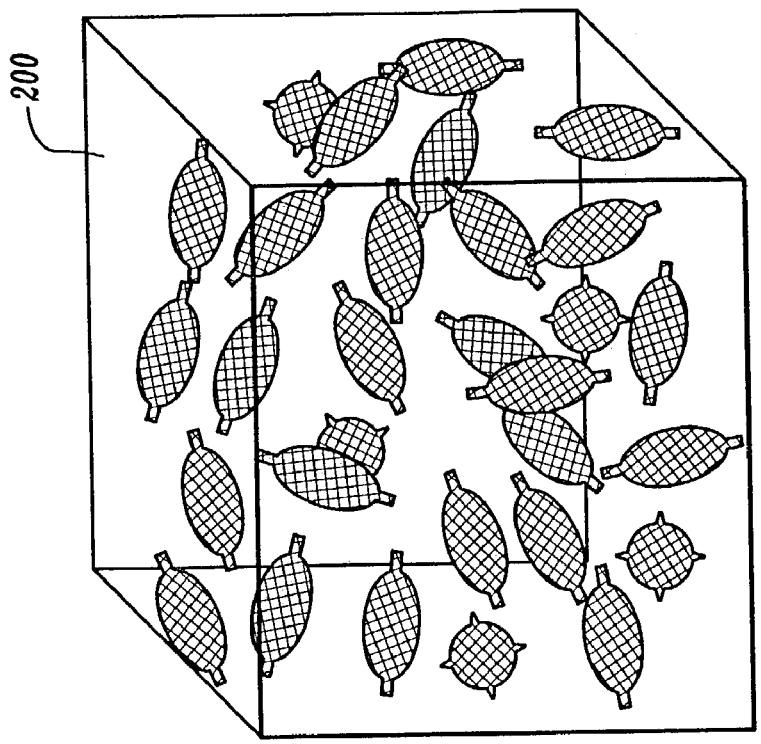
FIG. 12b is a portional 3D view of a composite material represented by a cubic cell boundary containing a plurality of NTEs randomly dispersed as a filler, according to another embodiment of the present invention.
Figure 12B:
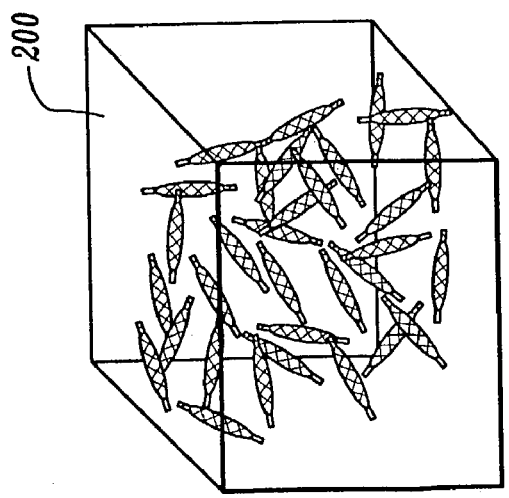

FIG. 12a is a cross-sectional view of a portion of a typical electrical interposer. An interposer is a device which, for example, connects a multichip ceramic module to an organic printed wiring board. FIG. 12a illustrates an interposer with carrier sheet 202 with contact buttons 200 being held in place with metal bands 201. Figure is an exploded portional crosssectional view of a contact, or conductive column, of an interposer assembly, according to an embodiment of the present invention. More specifically, FIG. 12b illustrates an application of the NTEs devices in a matrix elastomer, e.g. siloxane or rubber. More specifically, FIG. 12b illustrates a composite material represented by a cubic cell boundry containing a plurality of NTEs devices randomly dispersed as a filler. In addition, FIG. 12 illustrates what happens to the composite material upon cooling. For example, viewing at the scale of an interposer such as shown in FIG. 12b, where each contact is on the order of a millimeter in size, the NTEs devices would be invisibly small to the naked eye. A substantial volume percent of the NTEs devices or NTEs powder is mixed with an elastomer to form a contact 200. In addition, when the temperature is lowered the rubber will contract according to its coefficient of thermal expansion but the NTEs powder will expand. Thereby, the overall resulting composite expansion or contraction will be a function of the mix ratio and the coefficient of thermal expansion values for both the elastomer and the negative expanding devices. Further, some mixes will give a net zero volume change upon temperature change. Some mixes will result in net volume expansion upon cooling (very unusual and useful property), and some mixes will result in net contraction at a reduced extent than would happen in the absence of the NTEs powder.

Figure 13B:
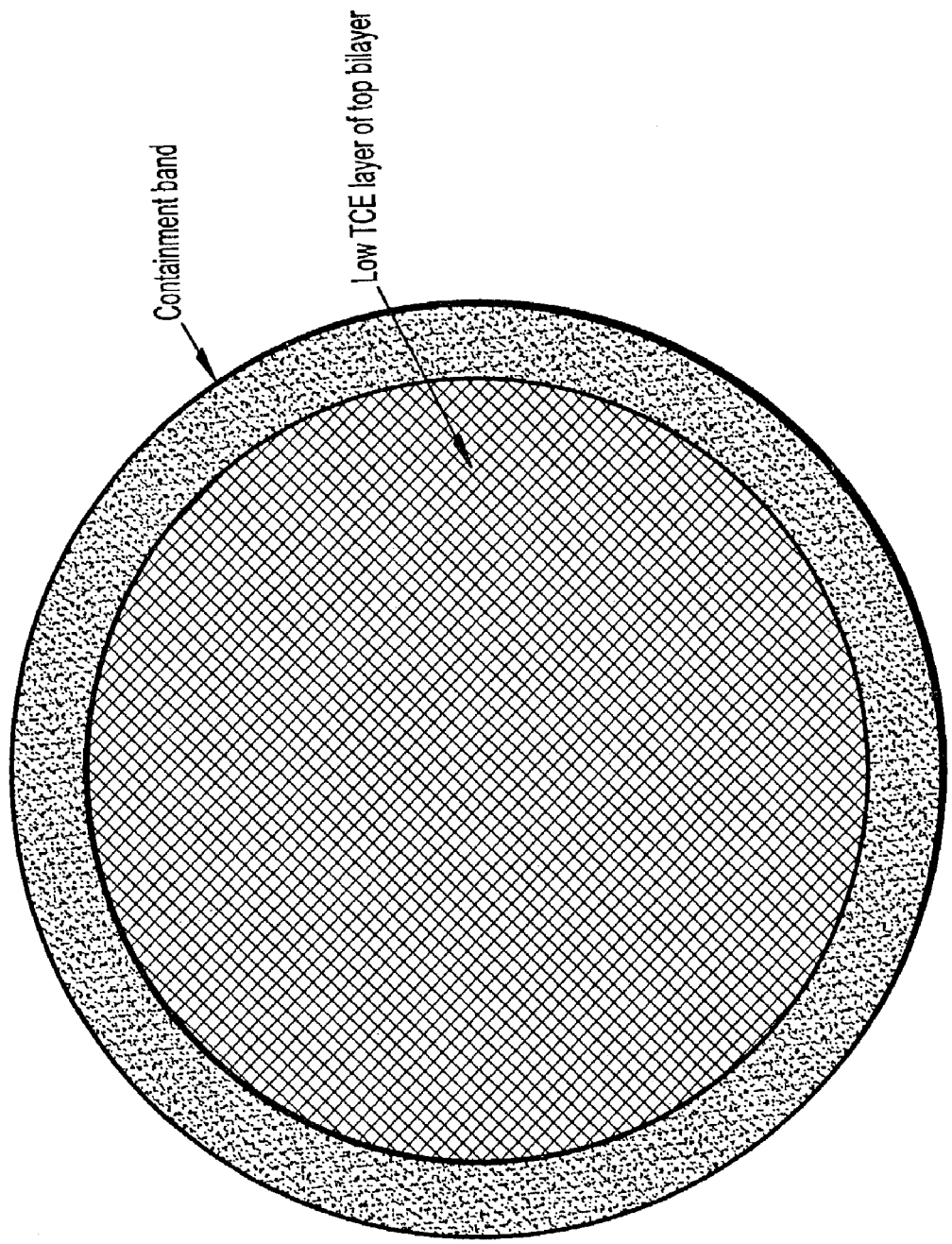
FIG. 13b illustrates a top view of a high performance NTEs device with unconstrained bilayers, according to another embodiment of the present invention.

FIG. 13a is a cross-sectional view of a NTEs device, according to another embodiment of the present invention. FIG. 13b is a top view of a NTEs device, according to another embodiment of the present invention. Referring to FIG. 13a, a NTEs is shown having unconstrained bilayers. The containment bands are made by a series of photolithography steps. For example, first the bottom of the band is formed, then in another step the tall part of the band cross-section is formed, and then in another step the top of the band is formed. A distinct design shown in FIGS. 13a and 13b offers larger values of negative thermal expansion by eliminating the bend strain imposed by the peripheral joining of the two bilayers in the other designs. This design utilizes an external constraint band made to keep the two free-floating bilayers properly oriented to one another. This design can be fabricated with traditional MEMs 2-D lithographic techniques, but it requires a greater number of photolithography steps.

In another embodiment, not shown in the figures, another type of high performance NTE could be constructed by joining the two bilayers together at the edges with hinge type structures. This would allow free changing of the angle between the two bilayers with little stress and yet keep them bound together. Hinge structures have been used in MEMs devices such as mirrors that can flip up into position. Similar hinge strategies could be employed here to join the two bilayers.

Figure 14A:
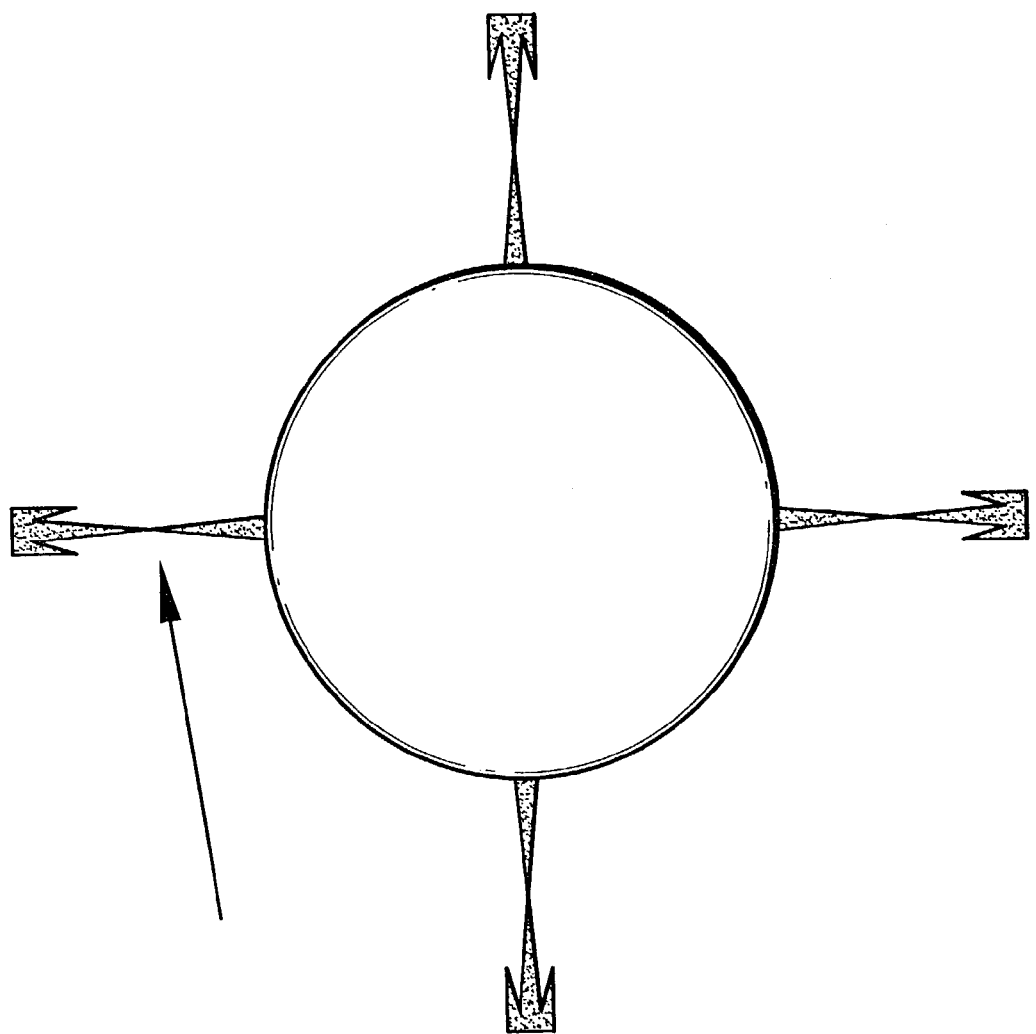
FIG. 14a illustrates a top view of a freestanding NTEs device, according to another embodiment of the present invention.
Figure 14B:
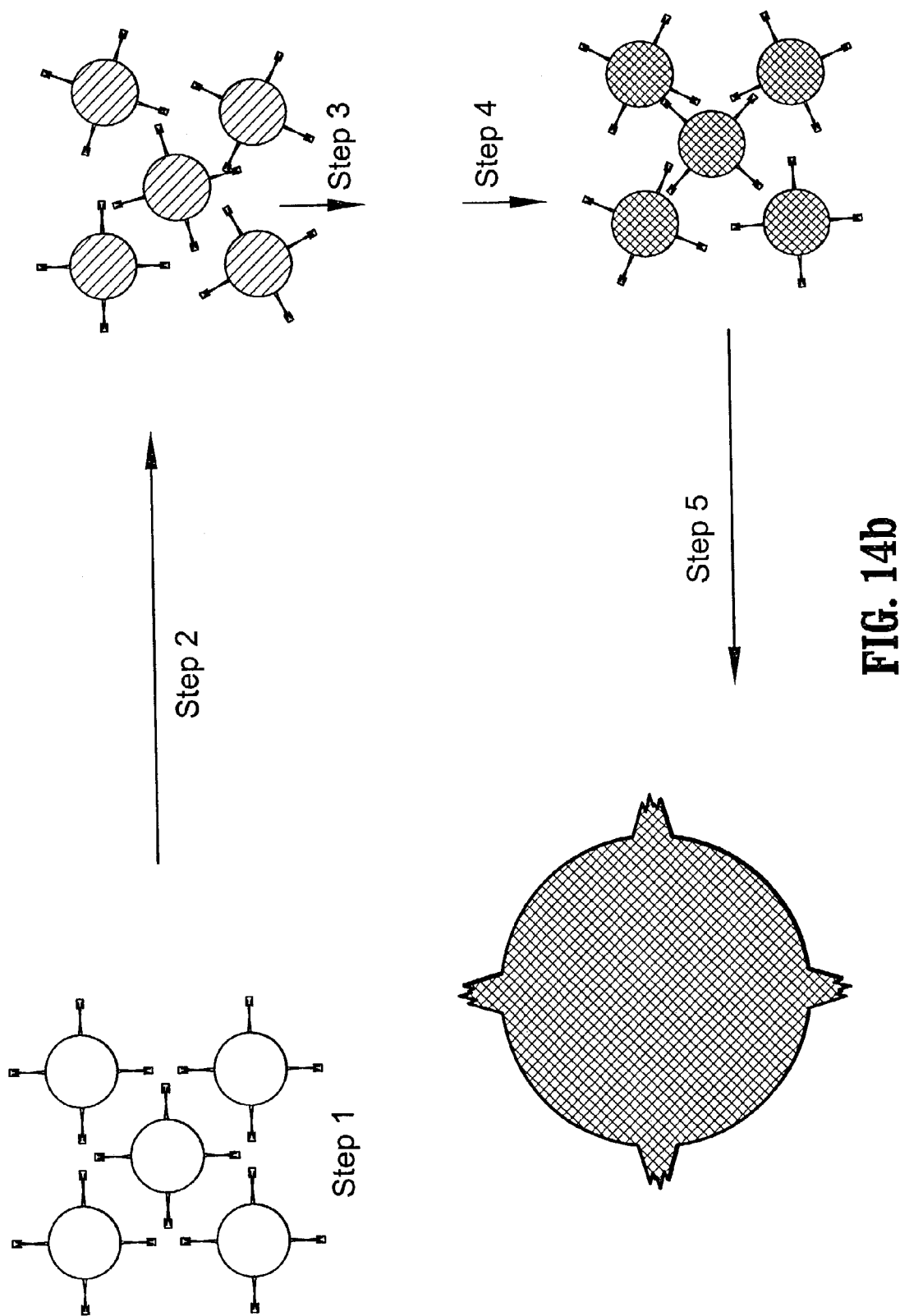
FIG. 14b depicts a series of sequential top views illustrating a 3D-fabrication method for making the NTEs devices, according to another embodiment of the present invention.

FIG. 14 is a top view of a free standing NTEs device, according to another embodiment of the present invention. FIG. 14b illustrates a series of sequential plan views of a 3-D bulk fabrication technique, according to another embodiment of the present invention. FIG. 14b is a sequential plan view illustrating a fabrication method much the same way as the previous case of FIGS. 7a-7d with a change in the method by which the disks are patterned. The steps 2-6 as stated above, in reference to FIGS. 7a-7d, are the same. More specifically, FIG. 14b illustrates a method of 3-D bulk fabrication technique utilizing metal plating that can be varied by eliminating the sheet structure caused by having the disks connected by the tapering fingers. Instead, as shown in FIGS. 14a and 14b the lithographic pattern defines discrete disks but includes a sacrificial end-cap structure on the end of each vent finger (step 1). This is to facilitate the tearing off at the weak narrow point by mechanical agitation following all the metallization steps. Again, this tearing is necessary to expose the polymer core to the outside environment in order to create an unblocked escape route for the gasses that will be evolved during the polymer decomposition anneal step.

The number of these fingers does not have to be four. only one vent per disk is necessary to allow proper gas venting. The probability that a tear will successfully occur goes up with duplication. But, only one is strictly necessary. Further, the dimensions of the finger structure shown are for illustration only. For most purposes the length of the structure between the disk and the narrow point should be as short as practical in order to produce NTEs disks with minimal distortion from a perfect disk shape. The length and shape of the end-cap structure from the narrow point out to the end of the finger should be optimized to tear off at the appropriate step in processing. They must endure the electroless or electroplating steps intact, but then tear off upon application of the mechanical stressing by high sheer mixing or by ultrasonic agitation. The hook structures are intended to allow the entanglement of disks in suspension so that the momentum of a mechanically excited second disk attached to the first disk via the hook will aid in tearing the weak point.

In another embodiment, not shown in the figures, a weak point in the disk outer edge could be designed in rather than construct a vent finger structure. This way, when the disk were heated to decompose the organic core, the pressure buildup would preferentially break through the weak point to provide a means of gas escape.

In another embodiment, one could mix the NTEs devices into a paste instead of into a thermosetting rubber compound. There are technological applications of paste such as for thermal management in computer packaging where maintaining good connection between the two opposing planes of a heat source (e.g., a semiconductor chip) and a heat sink is critical. Reducing, eliminating, or reversing the thermal expansion properties of the paste could mitigate a very significant technological challenge in high end computing.

Figure 15:
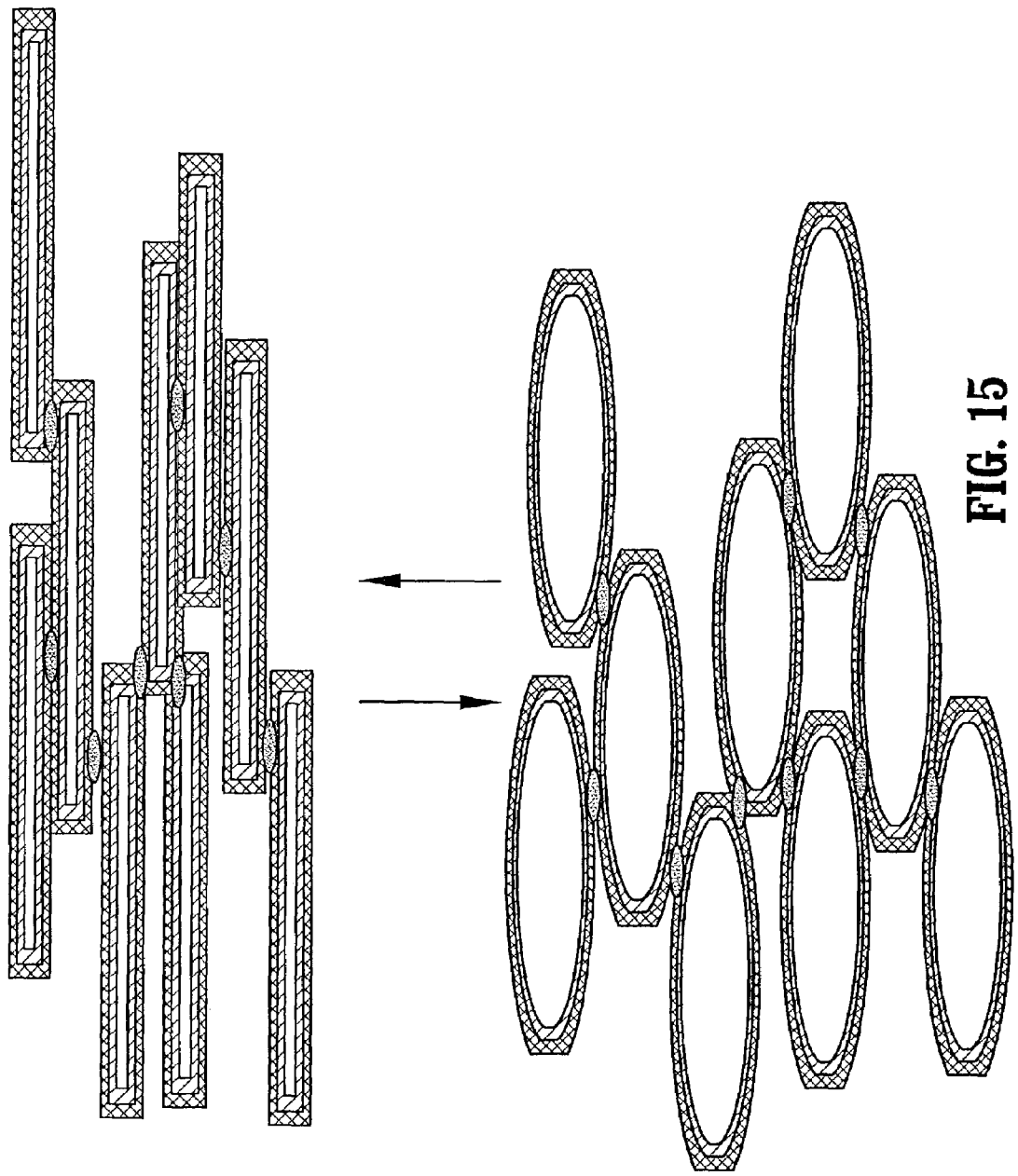
FIG. 15 is a cross-sectional view of a solid foam made from a plurality of NTEs devices, according to another embodiment of the present invention.

FIG. 15 is a cross-sectional view of a plurality of NTEs devices forming a solid foam structure, according to another embodiment of the present invention. More specifically, FIG. 15 illustrates a plurality of NTEs devices connected to one another with only a bare minimum of elastomer forming a solid foam structure. In addition, the minimum joining connections between the NTEs devices allows for a maximum degree of freedom in the expansion movement. One could also imagine joining them in other ways such as metallurgical bonding such that it would form a true metal foam with negative expansion properties.

In another embodiment, any combination of materials can be used as long as the inside layer is of a higher TCE than the outside layer. This could include for example metals, ceramics, polymers, and glasses.

In another embodiment, additional layers could be added to improve adhesion between layers, increase or decrease stresses as desired, or to change the surface properties of the particle.

In another embodiment, a thin outer layer of metal is applied such that it can impart electrical conductivity to the surface. The thin outer layer can be made thin enough that it does not adversely affect the expansion properties of the NTEs device. For example, 100 to 1000 Angstroms of gold or silver.

In another embodiment, where electrical conductivity is not desired, a non-metallic thin coating can be applied as an insulator. This coating can be thin enough that it does not adversely affect the expansion properties of the NTEs device.

The foregoing embodiments are merely exemplary and are not to be construed as limiting the present invention. The present teaching can be readily applied to other types of apparatuses and other scales of dimension. The description of the present invention is intended to be illustrative, and not to limit the scope of the claims. Many alternatives, modifications, and variations will be apparent to those skilled in the art.

What is claimed is:

1. A negative thermal expanding device comprising:
   a first bilayer having a first inner layer and a first outer layer, wherein the first inner and outer layers are formed of materials having a different coefficient of thermal expansion (CTE), wherein the CTE of the first outer layer material is lower than the CTE of the first inner layer material; and
   a second bilayer having a second inner layer and a second outer layer, wherein the second inner and outer layers are formed of materials having a different coefficient of thermal expansion (CTE), wherein the CTE of the second outer layer material is lower than the CTE of the second inner layer material,
   wherein the first and second bilayers are joined together along at least a portion of opposing perimeter regions of the first and second inner layers, and wherein the first and second bilayers are substantially planar at a first temperature and wherein the first and second bilayers flex and curve in opposite directions with decreasing temperature below the first temperature such that the device volumetrically expands with decreasing temperature.

2. A negative thermal expanding device comprising:
a first bilayer having a first inner layer and a first outer layer, wherein the first inner and otter layers are formed of materials having a different coefficient of thermal expansion (CTE), wherein the CTE of the first outer layer material is lower than the CTE of the first inner layer material; and
a second bilayer having a second inner layer and a second outer layer, wherein the second inner and outer layers are formed of materials having different coefficient of thermal expansion (CTE), wherein the CTE of the second outer layer material is lower than the CTE of the second inner layer material,
wherein the first and second bilayers are flexible layers, wherein the first and second bilayers are joined together along an entire perimeter region of the first inner layer of the first bilayer and an entire perimeter region of the second inner layers of the second bilayer, thereby forming a joint around the entire perimeter region of the first and second bilayers and forming an enclosed inner hollow cavity region, wherein the device volumetrically expands and contracts with changing temperature such that the enclosed inner hollow cavity region decreases in volume as a temperature of the device increases and wherein the enclosed inner hollow cavity region increases in volume as the temperature of the device decreases.

3. The device as recited in claim 1, wherein the first and second bilayers are formed and connected at the first temperature rendering the device in a low stress and geometrically flattened state, and wherein the device becomes increasingly stressed with decreasing temperature below the first temperature such that the device volumetrically expands with decreasing temperature below the first temperature and volumetrically contracts with increasing temperature toward the first temperature.

4. The device as recited in claim 3, wherein the first temperature is a predetermined temperature of operation of a final engineering application.

5. The device as recited in claim 4, wherein the application is a chip and the predetermined operating temperature is about 100° C.

6. The device as recited in claim 3, wherein the volume increases as the temperature of the device decreases below the predetermined temperature and wherein the volume decreases as the temperature of the device increases to the predetermined temperature.

7. The device as recited in claim 1, wherein the device can be mixed with a host elastomer material cured into a composite rubber which retains elastomeric properties while having a reduced overall coefficient of thermal expansion.

8. A negative thermal expanding device comprising:
a first layer of material having a first CTE (coefficient of thermal expansion);
a second layer of material having a second CTE which is greater than the first CTE;
a third layer of material having a third CTE which is substantially the same as the second CTE, wherein the second and third layers of material are joined together along at least a portion of perimeters thereof; and
a fourth layer of material having a fourth CTE which is substantially the same as the first CTE,
wherein each of the first, second, third and fourth layers are flexible layers, which are arranged and joined together along an entire perimeter of each of the first, second third and fourth layers to form a device structure that volumetrically expands with decreasing temperature and volumetrically contracts with increasing temperature.

9. The device as recited in clam 8, wherein the second and third layers of material are joined along an entire perimeter region of the second and third layers of material thereby forming a joint around the entire perimeter region and forming an enclosed inner hollow cavity region, wherein hollow cavity region decreases in volume as a temperature of the device increases and wherein the hollow cavity region increases in volume as the temperature of the device decreases.

10. The device as recited in claim 8 wherein the device is formed at a predetermined temperature rendering the device in a low stress and geometrically flattened state, and wherein the device becomes stressed at a temperature lower than the predetermined temperature causing a curvature in both the combination of the first and second layers of material and in the combination of the third and fourth layers of material in opposing directions that will increase the volume of the void between the second and third layers of material and increase a volume occupied by the device.

11. The device as recited in claim 10, wherein the predetermined temperature is an operating temperature of a final engineering application.

12. The device as recited in claim 11, wherein the application is a chip and the predetermined temperature is about 100° C.

13. The device as recited in claim 10, wherein the volume increases as the temperature of the device decreases below the predetermined temperature and wherein the volume decreases as the temperature of the device increases to the predetermined temperature.

14. The device as recited in claim 8, wherein the device can be mixed with a host elastomer material cured into a composite rubber which retains elastomeric properties while having a reduced overall coefficient of thermal expansion.

15. The device as recited in claim 2, wherein the first and second bilayers are joined using an adhesion layer forming an outer wall around the cavity.

16. The device of claim 15, wherein the adhesion layer is either a fine line of adhesive or a layer of material.

17. The device as recited in claim 2, wherein the cavity has small openings or vias connecting an outside environment.

18. The device of claim 1, wherein the first and second bilayers are joined by a circular band with right angle projections at an edge to contain the first and second bilayers from escaping their relative orientation relative to one another whereby enhancing the negative coefficient of thermal expansion behavior.

19. The device as recited in claim 1, the device is mixed with a paste to reduce the coefficient of thermal expansion of the paste.

20. The device as recited in claim 1, wherein the device is joined together with small amounts of an elasomeric adhesive to produce a foam-like solid with a negative coefficient of thermal expansion.

21. The device as recited in claim 1, further comprising:
an adhesion layer for joining the first and second bilayer together, wherein the adhesion layer is an outer wall around the cavity.

22. The device of claim 21, wherein the adhesion layer is either a fine line of adhesive or a layer of material.

23. The device as recited in claim 21 wherein the cavity has small openings or vias connecting the outside environment to cavity of the NTLs.

24. The device of claim 1 wherein the first and second bilayers are joined by a circular band with right angle projections at the edge to contain the bilayers from escaping their relative orientation relative to one another whereby enhancing the negative coefficient of thermal expansion behavior.

25. The device as recited in claim 1 wherein NTLs devices are mixed with a paste thereby reducing the coefficient of thermal expansion of the paste.

26. The device as recited in claim 8, further comprising:
an adhesion layer for joining the second and third layer together, wherein the adhesion layer is an outer wall around the cavity.

27. The device of claim , wherein the adhesion layer is either a fine line of adhesive or a layer of material.

28. The device as recited in claim 26 wherein the cavity has small openings or vias connecting the outside environment to cavity of the NTLs.

29. The device of claim 8 wherein the second and third layers are joined by a circular band with right angle projections at the edge to contain the bilayers from escaping their relative orientation relative to one another whereby enhancing the negative coefficient of thermal expansion behavior.

30. The device as recited in claim 8 wherein NTLs devices are mixed with a paste thereby reducing the coefficient of thermal expansion of the paste.

* * * * *